United States Patent [19]
Monoe

[11] Patent Number: 5,507,639
[45] Date of Patent: Apr. 16, 1996

[54] HEAT TREATMENT APPARATUS AND METHOD THEREOF

[75] Inventor: Osamu Monoe, Sagamihara, Japan

[73] Assignees: Tokyo Electron Kabushiki Kaisha, Tokyo; Tokyo Electron Tohoku Kabushiki, Kaisha, Iwate, both of Japan

[21] Appl. No.: 266,767

[22] Filed: Jun. 28, 1994

[30]  Foreign Application Priority Data

| Jun. 30, 1993 | [JP] | Japan | 5-186773 |
|---|---|---|---|
| Jul. 6, 1993 | [JP] | Japan | 5-191927 |
| Jul. 6, 1993 | [JP] | Japan | 5-191928 |
| Jul. 6, 1993 | [JP] | Japan | 5-191929 |
| Jul. 6, 1993 | [JP] | Japan | 5-191930 |

[51] Int. Cl.$^6$ ............................................. F27D 15/02
[52] U.S. Cl. .................... 432/77; 432/83; 432/84; 432/123; 432/152; 432/239
[58] Field of Search ....................... 432/77, 83, 84, 432/123, 152, 239

[56]  References Cited

U.S. PATENT DOCUMENTS 5,249,960  10/1993  Monoe .
5,323,484   6/1994  Nakao et al. .

FOREIGN PATENT DOCUMENTS

| 59-61120 | 4/1984 | Japan . |
|---|---|---|
| 61-195044 | 12/1986 | Japan . |
| 63-8128 | 3/1988 | Japan . |
| 63-121429 | 8/1988 | Japan . |

OTHER PUBLICATIONS

English language Abstract of JP 59–61120(A).

*Primary Examiner*—Henry A. Bennett
*Assistant Examiner*—Siddharth Ohri
*Attorney, Agent, or Firm*—Beveridge, DeGrandi, Weilacher & Young

[57]  ABSTRACT

Nozzles that blow an air are disposed in a space between an outer wall of a process tube and a heat generating resistor. The openings of the nozzles are oriented to the process tube corresponding to an arrangement area of semiconductor wafers. An air blowing angle and alignment of the openings of the nozzles are designated corresponding to the length of the arrangement area of the semiconductor wafers. Thus, since a portion where natural heat radiation is weak is forcedly cooled, the cooling effect can become equal in the entire region of the process tube, thereby reducing temperature drop time.

30 Claims, 15 Drawing Sheets

HEAT TREATMENT APPARATUS AND METHOD THEREOF

BACKGROUND OF THE INVENTION

1. Field of the Invention

The present invention relates to a heat treatment apparatus for accurately treating a workpiece and a method thereof.

2. Description of the Related Art

When a diffusion layer, a silicon oxide film, a silicon nitride film, or the like is formed on a workpiece (such as a semiconductor wafer or a glass substrate on which an amorphous Si layer is formed for an LCD), various heat treatment apparatuses are used. In these apparatuses, a workpiece is placed in a process tube that is a reaction vessel. In the process tube, the workpiece is heated. In addition, an inert gas or a carrier gas (which is referred to as a process gas) is supplied to the process tube so as to perform a predetermined heat treatment.

In such a heat treatment apparatus, after the treatment is completed, the inside of the process tube is cooled to a predetermined temperature. Thereafter, the workpiece is unloaded from the process tube. However, if a hot workpiece were unloaded to the outside of the apparatus, an oxide film would grow on the surface of the workpiece. Thus, the yield of the workpiece would decrease and the characteristics of the workpiece, in particular, the characteristics of the semiconductor devices would degrade. As high speed operations and high integration have been required for integrated circuits, heat diffusion of impurities should have been performed in shallow regions. Thus, technologies for improving diffusing accuracies and controlling the depth of diffusion of impurities with good repeatability have been required. To control the process of the shallow diffusion, a semiconductor wafer, which is a workpiece, should be heated to a diffusion process temperature in a short time. In addition, the diffusion process temperature holding time and the temperature drop time should be repeated by the same program.

Technologies for quickly cooling the process tube to a predetermined temperature and equally cooling the entire surface of each wafer are disclosed as Japanese Utility Model Registration Laid-Open Publication Nos. 63-121429 and 63-8128.

According to the former publication, a process tube is cooled by a spiral air current formed in the longitudinal direction thereof. According to the latter publication, at least one air blow pipe for supplying cooling compression air is disposed between a heating coil and a process tube. Air is exhausted from an opposite furnace opening.

However, in the constructions described in these publications, the cooling speed and cooling equality were not sufficient.

In other words, according to the construction of the former publication, it was difficult to generate the spiral air current along the process tube. Even if the spiral air current were generated, a guide means would be required. Thus, the construction would be complicated. In addition, since the air current would be subject to flow resistance, sufficient cooling speed could not be obtained.

According to the construction of the latter publication, since cooling air is supplied and exhausted by pipes, air current would be irregularly generated. In addition, when air is supplied and drained by the pipes, the flow amount and flow speed of the air tend to be restricted. Thus, the improvement of the cooling equality is limited. Moreover, in this construction, although the cooling air is forcedly supplied, the waste air is not forcedly exhausted. Thus, it is difficult to generate an equal air current.

In recent years, high speed heat treatment apparatuses with a temperature rise/drop speed of at least 30° C./min or higher, preferably 100° C./min (temperature rise state) and 60° C./min (temperature drop state) have been required. Thus, a growth of for example an oxide film in loading/unloading temperature setting periods rather than real treatment process adversely affects fabrications of highly integrated memory chips of 16 MB and 64 MB. On the other hand, the process tube is heated by a heat generating resistor. The heat generating resistor should equally heat the process tube. In addition, the heat generating resistor should have a simple construction and prevent an interference with a temperature detecting portion.

SUMMARY OF THE INVENTION

Therefore, an object of the present invention is to solve the problems involved in the conventional heat treatment apparatuses and to provide a heat treatment apparatus with a heating member that is simply constructed, quickly raises and lowers the temperatures of a plurality of workpieces, and equally performs temperature rising and lowering processes for the workpieces.

A first aspect of the present invention is a heat treatment apparatus, comprising an upright type process tube having at least one opening and for performing a batch treatment for a plurality of workpieces accommodated in a boat, a heat insulator disposed outside the upright type process tube, a heat generating resistor disposed between the heat insulator and the upright type process tube and for heating the workpieces disposed in the upright type process tube through heat radiation, a vertically movable conveying device for loading and unloading the boat accommodating the workpieces, into and from the opening of the upright type process tube, a temperature keeping member for supporting the boat, and a nozzle having a nozzle opening disposed between the upright type process tube and the heat generating resistor and adapted for blowing a cooling air, wherein the nozzle blows the cooling air to a wall surface portion of the upright type process tube corresponding to an arrangement area of the workpieces.

A second aspect of the present invention is a heat treatment apparatus, comprising an upright type process tube for performing a batch treatment for a plurality of workpieces, a cylindrical heat insulator disposed outside the upright type process tube, a heat generating resistor disposed on an inner wall surface of the heat insulator, the heat generating resistor having a plurality of vertical portions peripherally spaced and a plurality of bend portions disposed alternately at upper and lower positions of the vertical portions, the vertical portions being connected to each other through the bend portion, and a detecting device for detecting the temperature inside the heat insulator, wherein the detecting device penetrates the heat insulator, the distal end of the detecting device extends inside the heat insulator, and the distal end is disposed between the adjacent vertical portions of the heat generating resistor.

A third aspect of the present invention is a heat treatment apparatus, comprising an upright type process tube for performing a batch treatment for a plurality of workpieces, a heat insulator disposed outside the upright type process tube and peripherally divided into two portions, a heat generating resistor disposed on an inner wall surface of each of divided portions of heat insulator, both end portions of each heat generating resistor extending outward from the corresponding divided portions of the heat insulator, and a joint terminal member disposed outside and in the vicinity of each of the divided portions of the heat insulator, the joint terminal member having electrode terminals opposed to the both end portions of the heat generating resistor, wherein the electrode terminals of the joint terminal member and terminal portions of the heat generating resistor are connected by flat woven members.

A fourth aspect of the present invention is a heat treatment apparatus, comprising an upright type process tube for performing a batch treatment for a plurality of workpieces, a heat insulator disposed outside the upright type process tube and vertically divided into a plurality of heating zones, and a heat generating resistor disposed on an inner wall surface of each heating zone of said heat insulator, the heat generating resistor having a plurality of vertical portions peripherally spaced and a plurality of bend portions disposed alternately at upper and lower positions of the vertical portions, the vertical portions being connected to each other through the bend portion, wherein the bend portions of each of the heat generating resistor members extend beyond the boundary of each of the heating zones so that the bend portions are engaged with each other at the boundary of the adjacent heating zones, and wherein both end portions of each heat generating resistor protrude outward from the heat insulator at the upper end of the corresponding heating zone, the bend portions adjacent to both end portions being disposed at the lower end of the corresponding heating zone.

A fifth aspect of the present invention is a heat treatment apparatus, comprising an upright type process tube for performing a batch treatment for a plurality of workpieces, a heat insulator disposed outside the upright type process tube, and a first heat generating resistor and a second heat generating resistor peripherally divided and disposed on an inner wall surface of the heat insulator, both end portions of each of the first and second heat generating resistors extending outward from the heat insulator, wherein one end portion of the first heat generating resistor is adjacent to one end portion of the second heat generating resistor member, the current direction of the one end portion of the first heat generating resistor being reverse to that of the one end of the second heat generating resistor member.

A sixth aspect of the present invention is a heat treatment method for performing a heat treatment for a plurality of workpieces coaxially and vertically disposed in an upright type process tube in an airtight atmosphere, the method comprising the steps of performing a heat treatment, and blowing a cooling air toward a wall surface portion of the process tube corresponding to a center portion of an arrangement area of the workpieces or a higher portion thereof.

According to the first and sixth aspect of the present invention, the nozzles that blow the cooling air to the wall surface portion of the process tube corresponding to the arrangement area of the semiconductor wafers, which are workpieces, are disposed between the wall surface of the outer periphery of the process tube and the inner peripheral surface of the heat generating resistor. Thus, the temperature drop effect can be improved. Consequently, the heat radiation area is extended to the upper portion of the process tube so as to prevent uneven temperature drop from taking place between the opening portion of the process tube and the upper area thereof. As a result, the temperature of the entire area of the process tube can be equally dropped.

According to the second aspect of the present invention, the detecting device has the distal end portions penetrating the heat insulator and are disposed between two peripherally adjacent vertical portions of the heat generating resistor. Thus, even if the heat generating resistor is deformed by aged tolerance, the detecting device does not come in contact with the heat generating resistor. Consequently, since a load of the weight of the heat generating resistor is not applied to the detecting portion, it is not necessary to increase the rigidity of the detecting device, thereby preventing the dimensions of the detecting device from being increased. Thus, since the heat capacity of the detecting device is not increased, heat transfer from the end portion can be decreased, thereby reducing the difference between the temperature detected at the end portion and the real temperature. As a result, the control characteristics such as high speed temperature rise/drop can be improved.

According to the third aspect of the present invention, since a wire from the power source is not directly connected to the end portion of the heat generating resistor, a load of the weight of the wire applied to the heat generating resistor can be decreased. In other words, there is provided the joint member between the end portion of the heat generating resistor and the power source. Thus, since the flat woven member that is light in weight is used as the joint member, a load that is mainly weight applied to the heat generating resistor member can be reduced. Thus, the heat generating resistor can be prevented from being broken.

According to the fourth aspect of the present invention, the end portion of the heat generating resistor can be placed in the same position in each zone. In reality, the end portion can be placed at an upper position in each zone. In the case that the bend portions are engaged with each other at the boundary of adjacent zones, when one of the heat generating resistors has the different pitches of the bend portions between the end portions and center portion, the end portions of the heat generating resistor can be placed at common positions in each zone. Thus, even if the heat generating resistor is expanded by heat, the end portions thereof can be prevented from being stressed. In addition, the shape and assembling process for each zone of the process can become common.

According to the fifth aspect of the present invention, the adjacent end portions of the first and second heat generating resistors that are peripherally divided are connected in such a manner that the current direction of the former is reverse to the current direction of the latter. Thus, the magnetic force generated by the first heat generating resistor can be offset by the magnetic force generated by the second heat generating resistor. Consequently, the adjacent heat generating resistors can be prevented from being magnetically broken.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

First Embodiment

Next, with reference to FIGS. 1 to 7, a first embodiment of the present invention will be described.

Figure 1A:
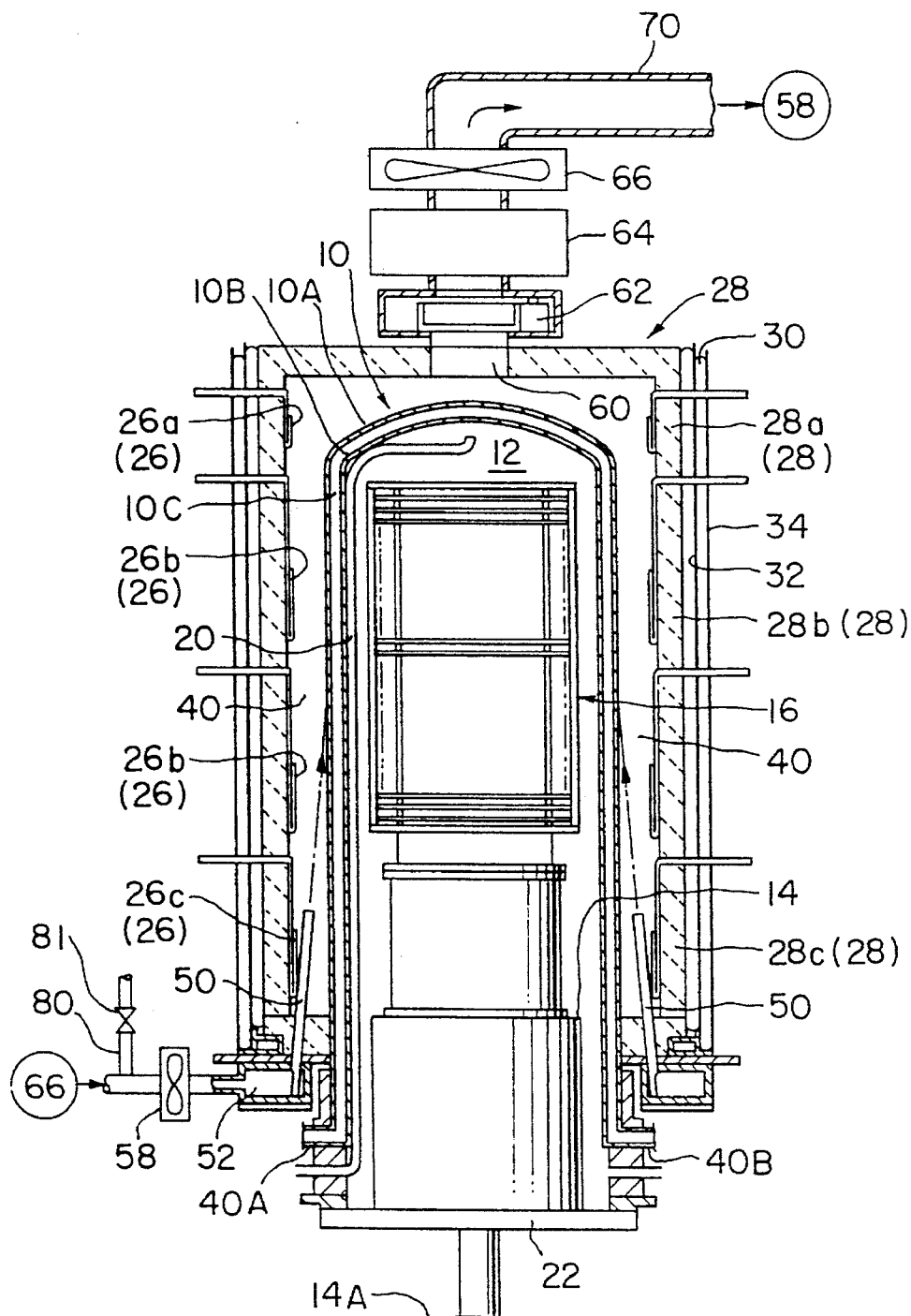
FIG. 1A is a sectional view showing a heat treatment apparatus according to a first embodiment of the present invention.

FIG. 1A shows an upright type heat treatment apparatus used for oxidizing and diffusing treatments of semiconductor wafers.

This heat treatment apparatus is provided with a process tube 10 made of, for example, highly purified quartz, which transmits radiated heat rays such as infrared rays and does not produce impurities at high temperatures. The process tube 10 has an opening portion at the lower end. A supporter that is a base plate made of for example stainless steel (not shown) is disposed at the opening portion of the process tube 10. The longitudinal direction of the supporter accords with the vertical direction of the process tube 10. A furnace 12 is disposed in the process tube 10.

A boat 16 that accommodates workpieces is disposed on a temperature keeping tube 14. The boat 16 can be loaded and unloaded into and from the process tube 10. A large number of semiconductor wafers 18 are horizontally arranged with equal vertical pitches in the boat 16.

A pipe 20 that delivers a process gas from the outside of the process tube 10 is disposed in the furnace 12 so as to perform a desired treatment such as an oxidizing treatment or a diffusing treatment for the semiconductor wafers 18. The temperature keeping tube 14 is disposed above a flange cap 22 that is a lid of the process tube 10. The flange cap 22 is mounted on an elevator arm (not shown). The flange cap 22 is vertically moved by the elevator arm. Thus, the temperature keeping tube 14 and the boat 16 are vertically moved and thereby the opening portion (that is a boat insertion hole of the process tube 10 is airtightly closed by the cap 22). The temperature keeping tube 14 is connected to a motor (not shown) through a belt 14A. Thus, the temperature keeping tube 14 can be rotated.

A heater, for example, a circular cylindrical heat generating resistor 26, is coaxially disposed on the outer periphery of the process tube 10. A heat insulator 28 is disposed outside the heat generating resistor 26 and supports it. An outer shell 32 and a water cooling cover 34 are disposed on the outer periphery of the heat insulator 28. The water cooling cover 34 contains a water cooling pipe 30 that delivers a coolant.

The heat generating resister 26 is divided into a plurality of heat generating resistor members 26a, 26b, 26c, and so forth that individually heat a plurality of vertically divided zones of the furnace 12 (for example, top, center, and bottom zones). In this construction, at least the arrangement area of the semiconductor wafers 18, so-called equally heating zone, are heated. It should be noted that the number of divided zones is not limited to three. Instead, four zones, five zone, or the like may be employed corresponding to the application. This construction applies to the heat insulator 28. In other words, the heat insulator 28 is divided into heat insulator members 28a, 28b, and 28c corresponding to the top, center, and bottom zones, respectively. It should be noted that the heat insulator members may be integrally formed.

The heat insulator members 28a, 28b, and 28c are formed in circular cylinder shapes. Each of the heat insulator members 28a, 28b, and 28c is formed of two semi-circular cylinder members. Likewise, each of the heat generating resistor members 26a, 26b, and 26c is formed of two semi-circular cylinder members that are peripherally divided. The thickness of the heat insulator 28 is, for example, 45 mm or less so as to provide quick temperature rise/drop characteristics. In this embodiment, as long as the heat insulator 28 can support the heat generating resistor 26 and provide the heat resisting characteristics, the thickness of the heat insulator 28 should be as small as possible so as to improve the temperature change speed of the heat treatment furnace that quickly raises and drops the temperature.

An example of the material of the heat generating resistor members 26a, 26b, and 26c is molybdenum disilicide ($MoSi_2$). As a real example, KANTHAL super heater which is mainly composed of molybdenum disilicide can be used. The KANTHAL super heater is a trade name of KANTHAL-GADELIUS K. K. (Swedish company). The heat generating resistor members 26a, 26b, and 26c, which are made of molybdenum disilicide, have characteristics where their resistance is very small at normal temperatures and very large at high temperatures. The diameter (d) of the heat generating resistor 26 should be in the range of 1.5 to 6 (mm) so as to provide both durability for handling and machining and high speed temperature rise/drop characteristics. In addition, the surface load of the heat generating resistor 26 is preferably in the range from 10 to 30 $W/cm^2$ corresponding to the designed temperatures. The maximum surface load of the conventional heat generating resistor made of FeCrAl is 2 $W/cm^2$ at 1200° C. Thus, the amount of heat generation of this embodiment is 5 to 15 times that of the related art reference. The temperature rise speed of the conventional heat treatment furnace using the FeCrAl heat generating resistor is 10° C./min. On the other hand, the temperature rise speed of this embodiment is at least 30° C./min or more, preferably around 100° C./min. In addition, according to this embodiment, the temperature rise/drop characteristic is 20° C./min or more, for example 50° C./min.

Figure 2:
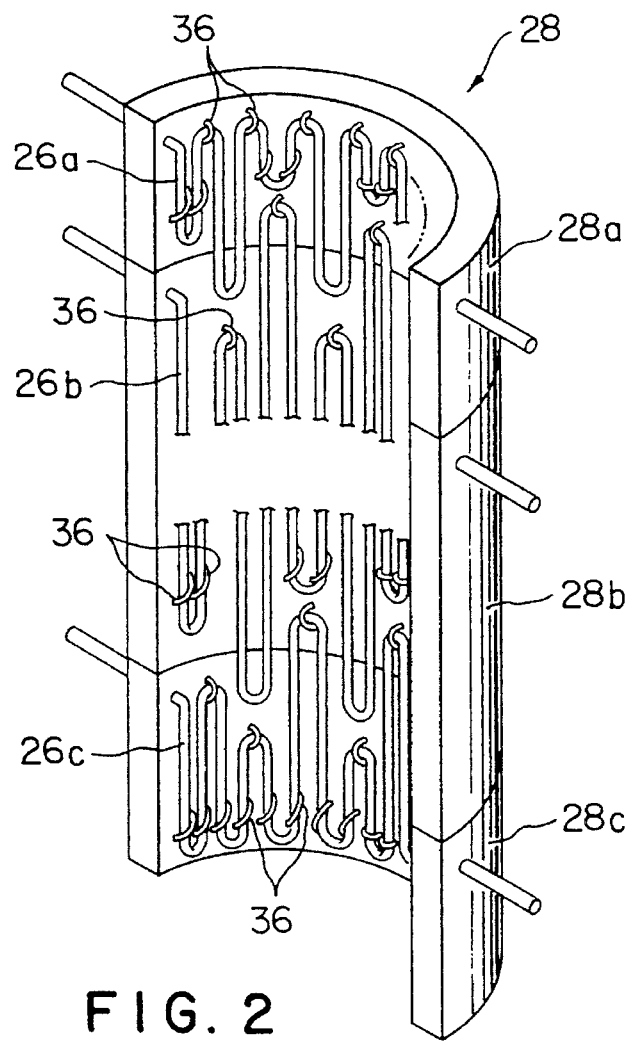
FIG. 2 is a perspective view showing a construction of a heat generating resistor used in the heat treatment apparatus of FIG. 1.

As shown in FIG. 2, each of the heat generating resistor members 26a, 26b, and 26c is formed in such a manner that one wire is extended vertically and bent in a U letter shape at upper and lower positions. These operations are repeated. This shape is referred to as meander shape.

Figure 3:
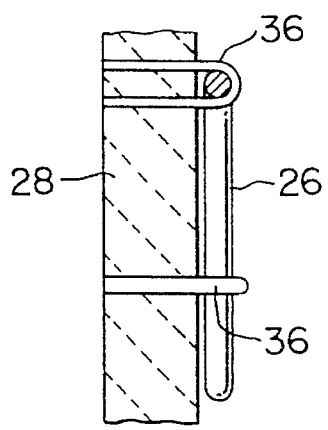
FIG. 3 is a partial sectional view showing a securing construction of a heat generating resistor member of FIG. 2.

The heat generating resistor members 26a, 26b, and 26c are stapled to the inner surfaces of the heat insulator members 28a, 28b, and 28c by staples 36. As shown in FIG. 3, the staples 36 hang and support the heat generating resistor members 26a, 26b, and 26c at the upper bend portions. In addition, the staples 36 secure the heat generating resistor members 26a, 26b, and 26c at their lower portions other than the lower bend portions in such a manner that the staples 36 have an angle with the heat generating resistor members 26a, 26b, and 26c. Since the lower bend portions of the heat generating resistor members 26a, 26b, and 26c are kept open, the heat generating resistor members 26a, 26b, and 26c can vertically move corresponding to heat expansion and heat shrinkage.

When the heat generating resistor members 26a, 26b, and 26c are heated, silicon oxide ($SiO_2$) films are formed thereon, which prevent them from being oxidized by oxygen in air. At least the surface of the staples, which are directly in contact with the heat generating resistor members 26a, 26b, and 26c, is formed of a material that is inactive with silicon dioxide at a high temperature environment of for example 1200° C. If the staples 36 are made of a material that is active with silicon dioxide, the heat generating resistor 26 will be broken at the positions of the staples 36. Examples of materials that are inactive with silicon dioxide are iron (Fe), copper (Cu), and nickel (Ni). The staples 36 may be made of a material that is inactive with silicon dioxide. Alternatively, the staples 36 may be made of the same material as the heat generating resistor members 26a, 26b, and 26c.

In FIG. 2, the U shaped bend portions of the heat generating resistor members 26a, 26b, and 26c alternately extend to the adjacent heating zones. Thus, at boundaries of top, center, and bottom zones of the heat generating resistor members 26a, 26b, and 26c, the bend portions thereof become long and short one after the other. Thus, the bend portions are closely and regularly arranged at the boundaries. As a result, the boundary in each heating zone can be equally heated. The heat generating resistor members may be vertically routed two or more times in each of the top, center, and bottom zones. In this case, not only the inside of each zone, but the vicinity of the boundary of each zone can be maintained at an equal temperature. It should be noted that a combination of the heat generating resistor members is not limited to the above-described method. Instead, as long as an equal temperature can be maintained, various methods may be used.

Figure 4:
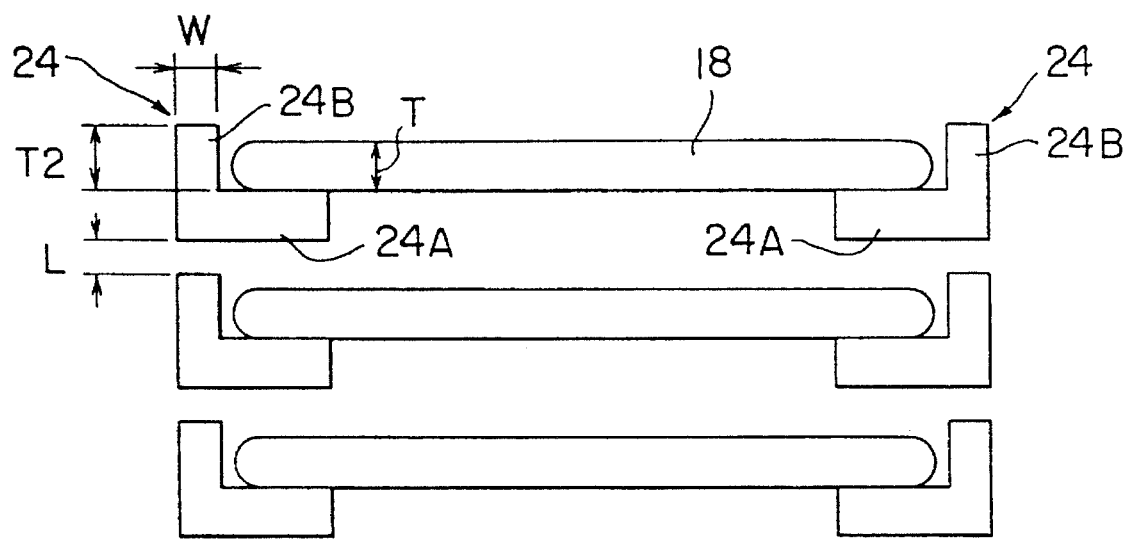
FIG. 4 is a schematic diagram showing a supporting construction of workpieces used in the heat treatment apparatus of FIG. 1.
Figure 5:
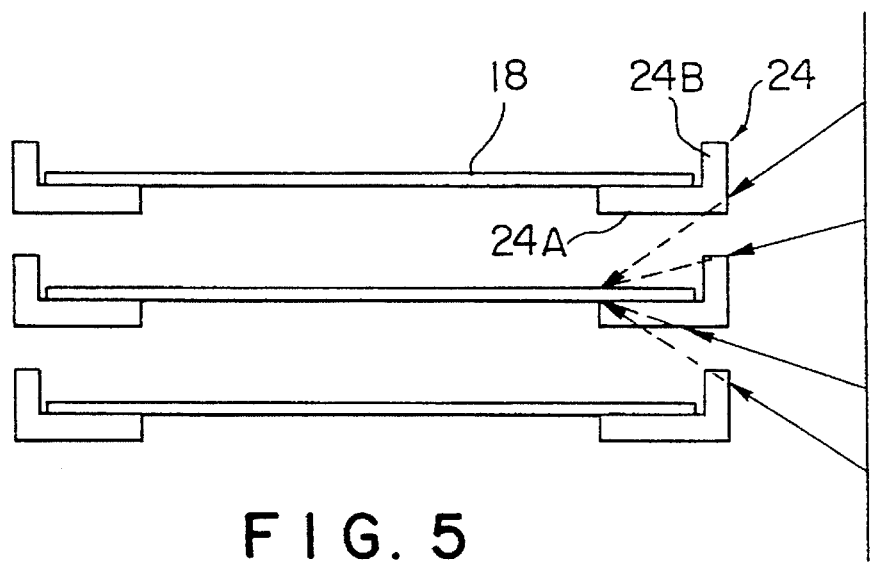
FIG. 5 is a schematic diagram for explaining an incident state of radiated heat in the supporting construction of FIG. 4.
Figure 6:
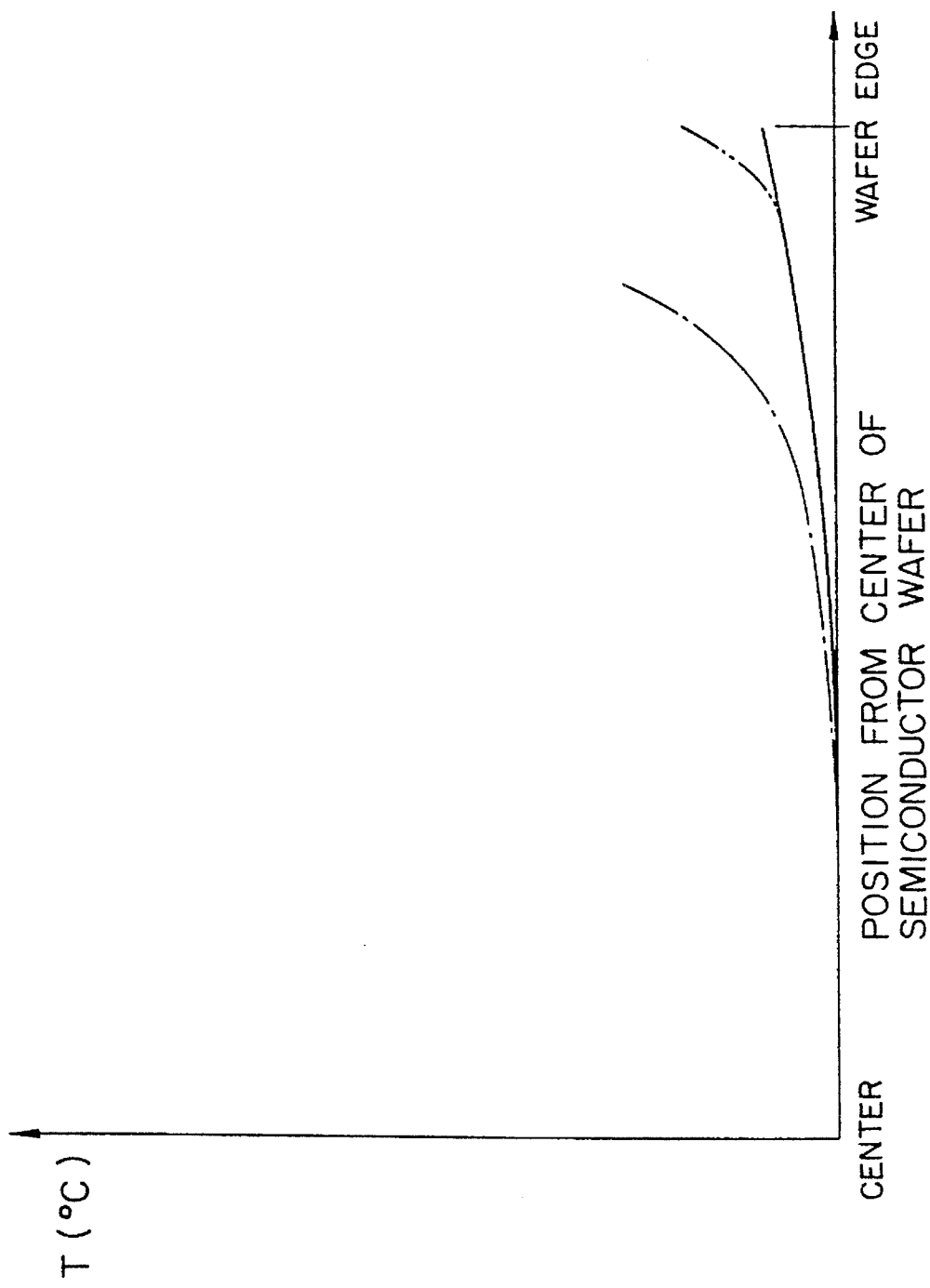
FIG. 6 is a graph for explaining a temperature distribution in the supporting construction of FIG. 4.

As shown in FIG. 4, the boat 16 is provided with a plurality of ring-shaped trays 24 that are vertically arranged. The ring-shaped trays 24 are members that horizontally and axially support semiconductor wafers 18 at their peripheral portions. An outer portion of the peripheral portion of the wafer tray 24, for example a side edge of a holding surface 24A thereof, has a side wall 24B that vertically extends. The thickness of the side wall 24B is equal to or larger than the thickness (T) of the semiconductor wafer 18 so as to prevent heat rays of the heat generating resistor 26 from directly entering the peripheral portion of the wafer (in FIG. 4, the thickness of the side wall 24B is denoted by T2). In the construction of the ring-shaped tray 24, since the thickness of the side wall 24B is equal to or larger than the thickness of the semiconductor wafer, the peripheral portion of the semiconductor wafer 18 can be prevented from being exposed to heat radiated from the heater and from being excessively heated. In other words, when the semiconductor wafers 18 are horizontally stacked, heat radiated from the heat source is blocked by upper and lower semiconductor wafers as shown by dotted line of FIG. 5. Thus, the heat is not transmitted to the entire surface including the center portion of the semiconductor wafer. Consequently, as shown by two-dot-dash line of FIG. 6, the heat is entered into the peripheral portion of each wafer. As a result, the temperature of only the peripheral portion of the wafer is raised. In this embodiment, the heat reaching the peripheral portion of the semiconductor wafer 18 is blocked by the side wall 24B so as to prevent the temperature of the peripheral portion from being excessively raised. A temperature change denoted by one-dot-dash line of FIG. 6 represents the case where the ring-shaped tray 24, which holds only the peripheral portion of the semiconductor wafer 18, is not provided. Thus, only with the ring-shaped tray 24, since the heat capacity at the peripheral portion is increased, the temperature thereof can be prevented from being raised. Consequently, in this embodiment, the heat capacity at the peripheral portion of the semiconductor wafer 18 is increased and the temperature at the peripheral portion is prevented from rising. In addition, since heat rays such as infrared rays are prevented from directly reaching the peripheral portion of the semiconductor wafer 18, the temperature distribution on the surface of the semiconductor wafer 18 becomes equal. The distance between two adjacent ring-shaped trays 24 (namely, the distance (L) between the bottom portion of the holding surface 24A of the upper ring-shaped tray 24 and the top portion of the side wall 24B of the lower ring-shaped tray 24) is defined as a space into/from which a conveying arm (not shown) that loads and unloads the semiconductor wafer 18 to and from the holding surface 24A can enter and retreat. On the other hand, the width (W) of the side wall 24B is defined as a size where the periphery of the semiconductor wafer 18 does not interfere with the side wall of the ring-shaped tray 24 in the case that they thermally expand.

As shown in FIG. 1A, the process tube 10 has a double-walled construction where there are an outer wall and an inner wall that are formed of an outer tube 10A and an inner tube 10B, respectively. A space 10C is formed between the tubes 10A and 10B. The tubes 10A and 10B are made of clear quartz, which transmits infrared rays, has heat resistance, and hardly generates impurities. The tubes 10A and 10B are integrally formed at the opening of the process tube 10 by a melting method so as to seal the space 10C. The space 10C is a path for collecting and conveying metal ions produced in the heat generating resistor 26 to the outside of the process tube 10. A clean gas delivery pipe 40A is connected to the space 10C. The clean gas delivery pipe 40A delivers a gas for collecting and conveying metal ions which enter the space 10C through the outer tube 10A to the outside of the process tube 10. The gas delivered to the space 10C is, for example, chlorine gas (which is a halogen gas) or oxygen gas. In addition, as a purge gas, nitrogen gas is used. These gases are supplied from a supply source (not shown) connected to the clean gas delivery pipe 40A. The chlorine gas is supplied with a volume ratio of 1 to 10%. The oxygen gas is supplied with a flow rate of 5 liters/min. These gases are supplied with a total flow rate of 5 to 8 liters/min. The gas delivered to the space 10C is exhausted to a collecting device (not shown) through an exhaust opening 40B.

Figure 1B:
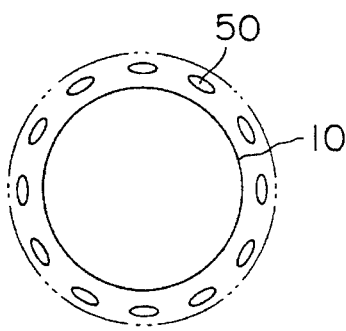
FIG. 1B is a plan view showing an arrangement of nozzles.

On the other hand, as shown in FIG. 1B, a plurality of (for example, 12) nozzles 50 that blow a cooling gas are disposed in a space portion 40 which is defined between the outer periphery of the process tube 10 and the inner wall of the heat insulator 28. The 12 nozzles 50 are disposed at equal pitches along the outer periphery of the process tube 10.

The nozzles 50 are disposed on an air delivery opening 52 in the peripheral direction on the lower surface of the heat insulator 28. The nozzles 50 are formed in an oval shape so as to prevent them from rotating about the air delivery opening 52. The nozzles 50 are disposed in such a manner that the shorter axis of the sectional shape thereof corresponds to the radial direction of the process tube 10. The reason why the oval shape is used instead of a perfect circle shape is as follows. If the perfect circle shape is used, unless the space between the process tube 10 and the heat insulator 28 is widened, a proper wall thickness of the supporting portion cannot be achieved. If the space is too large, the space between the tube 10 and the heat insulator 28 becomes large. Thus, the outer dimensions of the heat treatment apparatus cannot be suppressed.

The nozzle opening of the nozzle 50 faces toward the wall surface portion of the process tube 10 corresponding to the arrangement area of the semiconductor wafers 18 (namely, equally heating zone). The nozzles 50 may be vertically disposed and the opening portions thereof may be inclined toward the blowing region. The nozzles 50 may be formed in an arc shape or a ring shape.

The nozzles 50 are made of a material that transmits infrared rays, has a heat resistance, and hardly generates impurities. An example of this material is clear quartz. The nozzles 50 are disposed in such a manner that they do not block heat radiated from the heat generating resistor 26 to the wafers.

Figure 7:
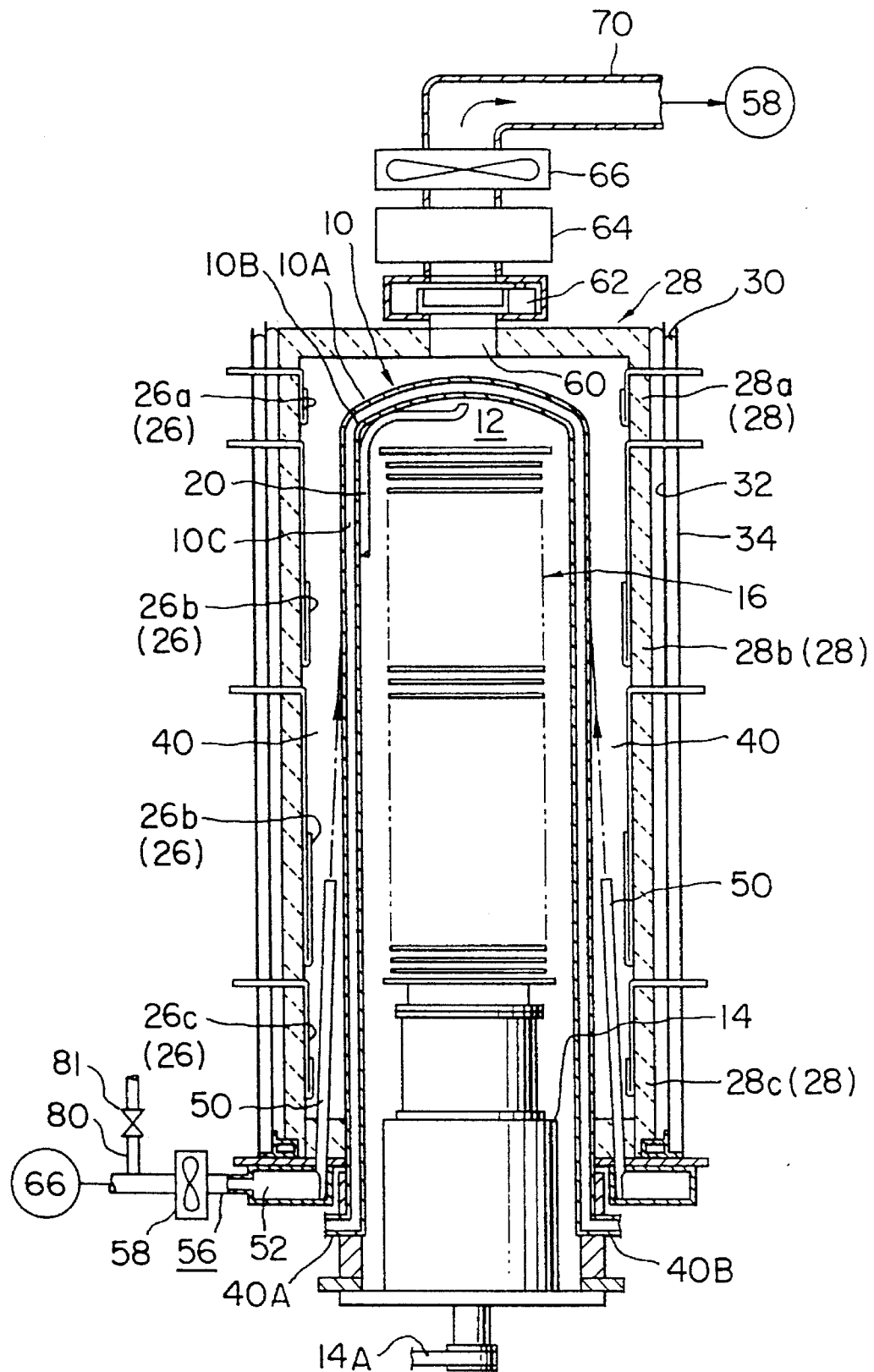
FIG. 7 is a sectional view for explaining a modified construction of principal portions of the heat treatment apparatus of FIG. 1.

The difference between the construction shown in FIG. 1A and the construction shown in FIG. 7 is the number of semiconductor wafers 18. In the construction shown in FIG. 1A, the number of semiconductor wafers 18 is for example 30. On the other hand, in the construction shown in FIG. 7, the number of semiconductor wafers 18 is for example 60. An air blown from the opening portions of the nozzles 50 is directed toward the wall surface of the process tube 10 corresponding to the center or upper portion of the arrangement region of the wafers.

The position to which the air is blown from the nozzles 50 depends on the size of the arrangement area of the semiconductor wafers 18. In other words, as shown in FIG. 1A, when the arrangement area of the semiconductor wafers 18 is small, since the distance between the position of the temperature keeping tube 14 and the top end of the boat 16 is short, an air is blown to a lower position of the half position of the arrangement area of the semiconductor wafers 18. On the other hand, as shown in FIG. 7, when the number of semiconductor wafers 18 is large and the distance between the position of the temperature keeping tube 14 and the top end of the boat 16 is long, air is blown to an upper position of the half position of the arrangement area of the semiconductor wafers 18. This is because the area where heat is naturally radiated is forcedly cooled regardless of the number of semiconductor wafers 18. As the number of semiconductor wafers 18 increases, the area which is forcedly cooled is upwardly moved. In other words, the orientation of the opening portions of the nozzles 50 and the air blowing position depend on the number of semiconductor wafers 18.

A blower 58 is connected to the air delivery opening 52 through a pipe 56. When electricity to the heat generating resistor 26 is stopped (namely, the heating process is stopped), the blower 58 is operated so as to forcedly deliver air to the nozzles 50.

An exhaust opening 60 is disposed at a ceiling portion of the heat insulator 28. The exhaust opening 60 exhausts air delivered from the nozzles 50 to the outside of the heat treatment apparatus. Thus, the exhaust opening 60 is preferably disposed at the center of the ceiling portion of the heat insulator 28 so as to rectify an air flowing in the space portion 40 along the outer periphery of the process tube 10. A heat exchanger 64 and an exhaust fan 66 are connected to the exhaust opening 64 through a shutter means 62. The shutter means 62 opens and closes the exhaust opening 60 through a drive device (not shown). In the cooling phase of the process tube 10, the shutter means 62 is opened and thereby the process tube 10 is connected to the exhaust opening 60. The shutter means 62 prevents air from leaking out from the exhaust opening 60. Thus, air which has cooled the process tube 10 and has not been heat exchanged can be prevented from leaking out from the exhaust opening 60 to the outside of the heat treatment apparatus. In addition, since such an air is prevented from leaking out, dust can be prevented from taking place.

A circulation pipe 70 is connected to a blow side of the exhaust fan 66. The circulation pipe 70 is connected to the blower 58. Thus, air exhausted from the exhaust opening 60 is cooled by the heat exchanger 64 and then directed to the air delivery opening 52 by the blower 58. In addition to the passageway for delivering air from the exhaust fan 64, another air intake passageway 80 is connected to the blower 58. The passageway 80 is provided with a valve 81. The passageway 80 and the valve 81 construct an outer air replenishing device. When the blower 58 is operated, the valve 81 is opened and outer air is replenished through the passageway 80 so as to prevent the amount of air blown from the nozzles 50 from decreasing. Thus, the shortage of air at the start-up of the blower 58 is prevented and the cooling efficiency of the process tube 10 is prevented from lowering. In this manner, the high speed temperature rise/drop, upright type heat treatment apparatus is constructed. According to a feature of this apparatus, high speed temperature rise/drop process is accomplished without needing to use an equally heating tube.

Next, the operation of the heat treatment apparatus will be described.

When a heat treatment (for example, oxidizing treatment) is to be performed for the workpieces 18, the boat 16, which holds the workpieces 18, for example 8-inch semiconductor wafers, is loaded into the furnace 12. After the furnace 12 is airtightly closed, the furnace 12 is heated by the heat generating resistor 26. After the furnace 12 is heated to a temperature where the growth of an oxide film is suppressed (for example, 600° C. or below), the boat 16 may be loaded into the furnace 12. The heat radiated from the heat generating resistor 26 reaches the semiconductor wafers 18 in the furnace 12 through the outer tube 10A and the inner tube 10B of the process tube 10. Thus, the temperature rise speed of the semiconductor wafers 18 is increased because of the absence of the equally heating member (equally heating tube). Since the semiconductor wafers 18 are placed on the ring-shaped trays 24, the heat capacity at the peripheral portion thereof is large. Thus, the temperature of the peripheral portion can be prevented from being quickly raised. In addition, since heat can be blocked by the side wall 24B, the temperature of the peripheral portion can be prevented from abruptly being raised. Thus, the temperature rise/drop control is performed so that the temperature distribution on the wafer surface becomes equal.

When the above-described process is started, a gas that reacts with metal ions (such as chlorine gas, oxygen gas, or nitrogen gas) or a purge gas is supplied to the space through the clean gas delivery pipe 40A. These gases collect silicon dioxide ($SiO_2$) which is deposited from the heat generating resistor 26 being heated and metal ions such as Fe, Cu, and Na ions generated from the staples, which hold the heat generating resistor 26, from the outer tube 10A and exhausts these gases to the outside of the heat treatment apparatus through the exhaust opening 40B. Thus, since the metal ions entering the space 10C through the outer tube 10A are collected by these gases, which flow in the space, they do not penetrate the inside of the inner tube 10B. Consequently, heavy metal contamination against the semiconductor wafers 18 in the process tube 10 can be prevented. Thus, this heat treatment apparatus can be applied to fabrications of high integration memory chips such as 16 MB memory chips and 64 MB memory chips. The gas flow in the space 10C is performed at least while the process temperature is maintained and the process is continued. In addition, after electricity is supplied to the heat generating resistor 26 and the temperature of the process tube 10 is raised to the process temperature, the gas is delivered. When the heat treatment apparatus is cooled to the temperature where metal ions that contaminate the semiconductor wafers 18 are not produced from the heat generating resistor 26 and the staples, the gas can be stopped.

In the temperature drop process, electricity to the heat generating resistor 26 is stopped (namely, the heating process is stopped). Thereafter, the operation of the blower 58 is started so as to supply air to the air delivery opening 52 and blow the air from the openings of the nozzles 50. The air blown from the openings of the nozzles 50 is directed to an upper portion including the center position of the arrangement area of the semiconductor wafers 18 in the vertical direction of the process tube 10 as denoted by the one-dot-dash line of FIG. 7. Thus, the air absorbs heat from the outer peripheral wall of the process tube 10. Consequently, heat is naturally radiated at the opening of the process tube 10 and thereby the temperature thereof drops. The air blown to the upper portion of the process tube 10 causes the temperature to be forcedly dropped. Thus, in the entire vertical region of the process tube 10, the temperature drop effect is equally performed and the temperature is quickly dropped. In particular, after the heating process is stopped, the temperature drop speed of the ambient temperature at the upper portion of the process tube 10 is slow. When the forced air is blown to the area where heated air stays, since the temperature slope in the reaction tube is absent, the temperature drop effect is improved.

The air flowing to the upper portion along the outer wall surface of the process tube 10 is directed to the exhaust fan 66 through the exhaust opening 60. This air is directed to the heat exchanger 64 by the exhaust fan 66 and then circulated to the blower 58.

According to this embodiment, air which is blown to the outer peripheral wall of the process tube 10 through the nozzles 50 from the air delivery opening 52 can be circulated. Thus, since the amount of air supplied to the clean room can be decreased as small as possible, the amount of air consumed therein can be reduced.

In addition, according to this embodiment, since other than the cooling portion that is naturally heat-radiated can be forcedly cooled, the cooling efficiency in the entire vertical area of the process tube 10 can be equalized. Thus, the temperature drop speed of the process tube 10 can be increased.

Moreover, when the thickness of the heat insulator is decreased, heat radiated from the heat generating resistor can be effectively used so as to perform high speed temperature rise and drop processes. The thickness of the heat insulator used in the conventional apparatus is for example 50 mm or more. However, according to this embodiment, the thickness of the heat insulator is for example 25 mm. Thus, the high speed temperature rise process can be performed with higher control characteristic than the conventional apparatus.

The present invention is not limited to the above-described embodiment. Instead, the embodiments may be modified in various manners without departing from the spirit and scope of the present invention.

The workpiece according to the present invention may be at least planar workpieces. Besides semiconductor wafers, the workpieces may be LCD substrates. The heat treatment apparatus according to the present invention is not limited to the oxidizing treatment apparatus and the diffusing treatment apparatus. Instead, the present invention may be applied to an apparatus for a CVD treatment, an annealing treatment, or the like.

It should be noted that the process tube is not limited to the above-described double-walled construction. Instead, a forced cooling device may be used for a single-walled quartz tube.

As described above, according to the present invention, at least the temperature drop efficiency of the wafers can be improved. Thus, after the heating process is completed, the temperature drop time of the process tube can be shorted.

In addition, according to the present invention, air blown from nozzles can be circulated. Thus, the amount of air in the clean room in which the heat treatment apparatus is disposed can be reduced. Thus, the air supply control and cleaning control in the clean room can be reduced.

Second Embodiment

Next, with reference to FIGS. 8 to 14, a second embodiment of the present invention will be described.

Figure 8:
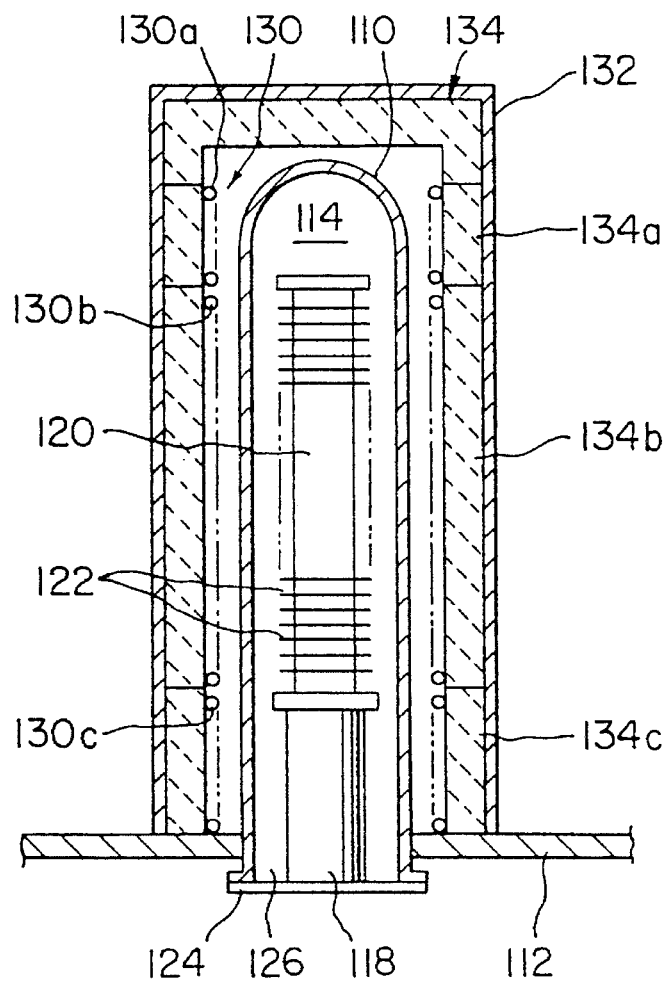
FIG. 8 is a sectional view showing a heat treatment apparatus according to a second embodiment of the present invention.

FIG. 8 shows a heat treatment apparatus used for oxidizing and diffusing treatments of semiconductor wafers.

This heat treatment apparatus is provided with a process tube 110 made of quartz. The process tube 110 is vertically supported by a base plate made of for example stainless steel (not shown). The process tube 110 is accommodated in a casing 132.

A furnace 114 is disposed in the process tube 110. A boat 120 is loaded and unloaded into and from the furnace 114. The boat 120 is placed on a temperature keeping tube 118. A large number of semiconductor wafers 122 are horizontally arranged with equal vertical pitches in the boat 120.

A gas is supplied from a process gas supply source (not shown) so as to perform a desired treatment. The temperature keeping tube 118 is disposed above a flange cap 124. The flange cap 124 is mounted on an elevator arm (not shown). The flange cap 124 is vertically moved by the elevator arm. Thus, the temperature keeping tube 118 and the boat 120 are vertically moved and thereby the opening portion (that is a boat insertion hole 126) of the process tube 110 is airtightly closed by the cap 124.

A heat generating resistor 130 is disposed on the outer periphery of the process tube 110. A heat insulator 134 is disposed outside the heat generating resistor 130 and supports it.

The heat generating resister 130 is divided into a plurality of heat generating resistor members 130a, 130b, 130c, and so forth that individually heat a plurality of vertically divided zones of the furnace 114 (for example, top, center, and bottom zones). It should be noted that the number of divided zones is not limited to three. Instead, four zones, five zone, or the like may be employed corresponding to the application. This construction applies to the heat insulator 134. In other words, the heat insulator 134 is divided into heat insulator members 134a, 134b, and 134c corresponding to the top, center, and bottom zones, respectively.

The heat insulator members 134a, 134b, and 134c are formed in circular cylinder shapes. Each of the heat insulator members 134a, 134b, and 134c is formed of two semi-circular cylinder members. Likewise, each of the heat generating resistor members 130a, 130b, and 130c is formed of two semi-circular cylinder members.

An example of the material of the heat generating resistor members 130a, 130b, and 130c is molybdenum disilicide ($MoSi_2$). As a real example, KANTHAL super heater which is mainly composed of molybdenum disilicide can be used. The KANTHAL super heater is a trade name of KANTHAL-GADELIUS K. K. (Swedish company). The heat generating resistor members 130a, 130b, and 130c, which are made of molybdenum disilicide, have characteristics where their resistance is very small at normal temperatures and very large at high temperatures. The maximum surface load of the conventional heat generating resistor made of FeCrAl is 2 $W/cm^2$ at 1200° C. Thus, the amount of heat generation of this embodiment is for example 20 $W/cm^2$, which is approximately 10 times that of the related art reference. Thus, according to this embodiment, strong power can be obtained. The temperature rise speed of the conventional heat treatment furnace using the FeCrAl heat generating resistor is 10° C./min. On the other hand, the temperature rise speed of this embodiment is for example 100° C./min. Thus, temperature rise characteristics for the above-described high speed heat treatment furnace can be accomplished.

Figure 9:
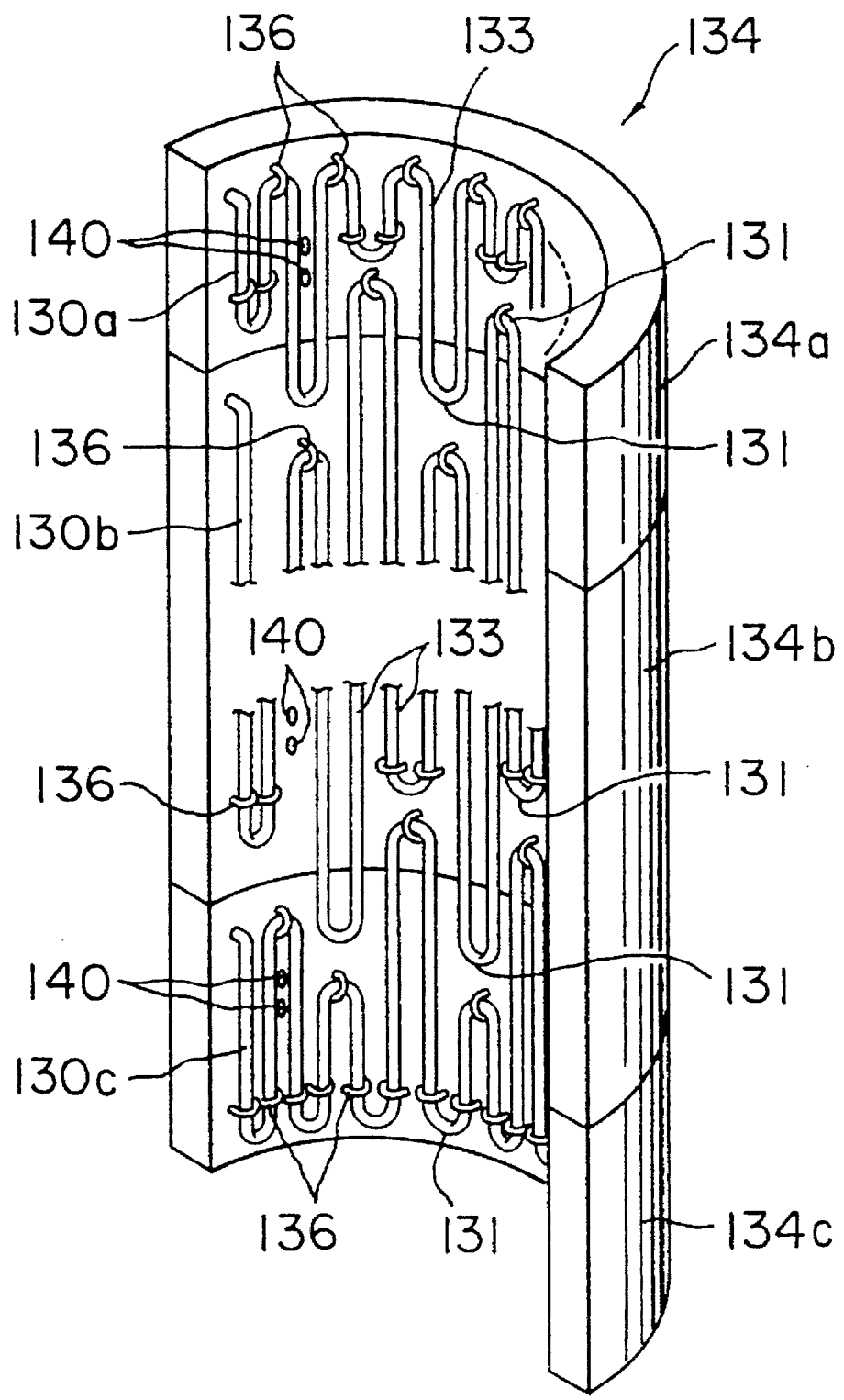
FIG. 9 is a perspective view showing a construction of heat generating resistor members used in the heat treatment apparatus of FIG. 8.

As shown in FIG. 9, each of the heat generating resistor members 130a, 130b, and 130c is formed in such a manner that one wire is extended vertically and bent in a U letter shape at upper and lower positions so as to form vertical portions 133 and bend portions 131. These operations are repeated. This shape is referred to as a meander shape.

Figure 10:
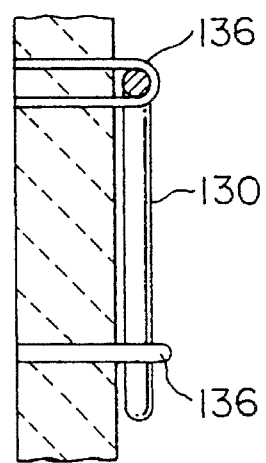
FIG. 10 is a partial sectional view showing a securing construction of the heat generating resistor member of FIG. 9.

The heat generating resistor members 130a, 130b, and 130c are stapled to the inner surfaces of the heat insulator members 134a, 134b, and 134c by staples 136. As shown in FIGS. 9 and 10, the staples 136 hang and support the heat generating resistor members 130a, 130b, and 130c at the upper bend portions 131. In addition, the staples 136 secure the heat generating resistor members 130a, 130b, and 130c at their lower vertical portions 133 other than the lower bend portions 136 in such a manner that the staples 136 have an angle with the vertical members 133 of the heat generating resistor members 130a, 130b, and 130c. Since the lower bend portions 131 of the heat generating resistor members 130a, 130b, and 130c are kept open, the heat generating resistor members 130a, 130b, and 130c can vertically move corresponding to heat expansion and heat shrinkage.

When the heat generating resistor members 130a, 130b, and 130c are heated, silicon oxide ($SiO_2$) films are formed thereon, which prevent them from being oxidized by oxygen in air. At least the surface of the staples, which are directly in contact with the heat generating resistor members 130a, 130b, and 130c, is formed of a material that is inactive with silicon dioxide at a high temperature environment of for example 1200° C. If the staples 136 are made of a material that is active with silicon dioxide, the heat generating resistor 130 will be broken at the positions of the staples 136. Examples of materials that are inactive with silicon dioxide are iron (Fe), copper (Cu), and nickel (Ni). The staples 136 may be made of a material that is inactive with silicon dioxide. Alternatively, the staples 136 may be made of the same material as the heat generating resistor members 130a, 130b, and 130c.

In FIG. 2, the U shaped bend portions 131 of the heat generating resistor members 130a, 130b, and 130c alternately extend to the adjacent heating zones. Thus, at boundaries of the top, center, and bottom zones of the heat generating resistor members 130a, 130b, and 130c, the bend portions 131 thereof become long and short one after the other. Thus, the bend portions 131 are closely and regularly arranged at the boundaries. As a result, the boundary in each heating zone can be equally heated. The heat generating resistor members 130a, 130b, and 130c may be vertically extended two or more times in each of the top, center, and bottom zones. In this case, not only the inside of each zone, but the vicinity of the boundary of each zone can be maintained at an equal temperature. It should be noted that a combination of the heat generating resistor members 130a, 130b, and 130c is not limited to the above-described method. Instead, as long as an equal temperature can be maintained, various methods may be used.

In the vicinity of each of the heat generating resistor members 130a, 130b, and 130c, a device for controlling the temperature in the corresponding zone is disposed.

Figure 11A:
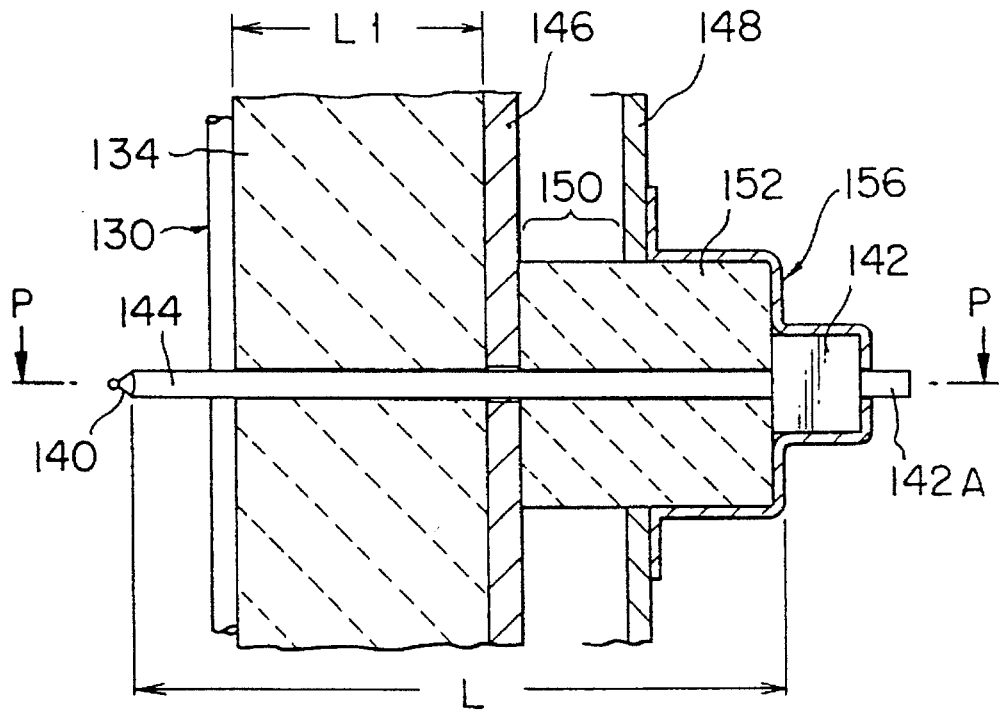
FIG. 11A is a sectional View showing a construction of principal portions of the heat treatment apparatus according to the present invention.
Figure 11B:
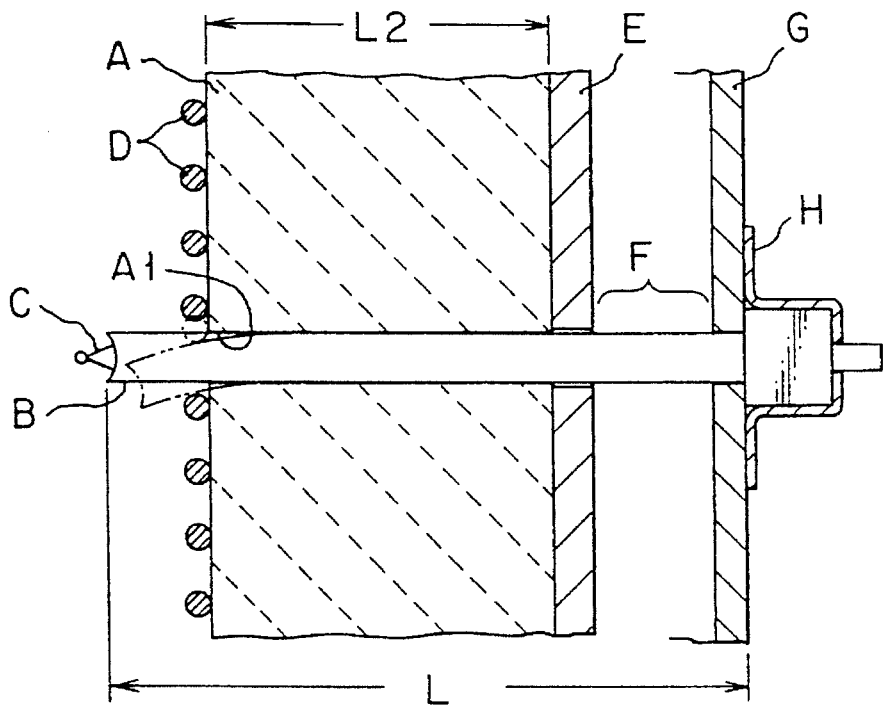
FIG. 11B is a sectional view showing a temperature controlling construction of a heat treatment apparatus according to a related art reference.

FIG. 11A is a horizontal sectional view showing a temperature control construction according to this embodiment. In this construction, a thermocouple 140 and a protecting member 144 are provided. The thermocouple 140 serves as a detecting portion.

The thermocouple 140 is constructed of a pair of resistor wires that are connected at the distal end thereof so as to form a closed circuit. As an example of such construction, the variation of electromotive force generated by the variation of resistance corresponding to the variation of temperature is output as a detected temperature.

The protecting member 144 is formed of a pipe in which the thermocouple 140 is inserted. The thermocouple 140 detects a temperature at only the forward end portion that extends from the heat insulator 134 disposed outside the process tube 110. Thus, the protecting member 144 penetrates the heat insulator 134, an outer shell 146, and a cooling passageway 150. The heat insulator 134 is disposed between a holder 142 and the distal end portion of the thermocouple 140. The cooling passageway 150 is formed between the outer shell 146 and a water cooling cover 148. The protecting member 144 is secured to an end portion of the holder 142. The thermocouple 140 extends from the forward end of the heat insulator 134.

Figure 12:
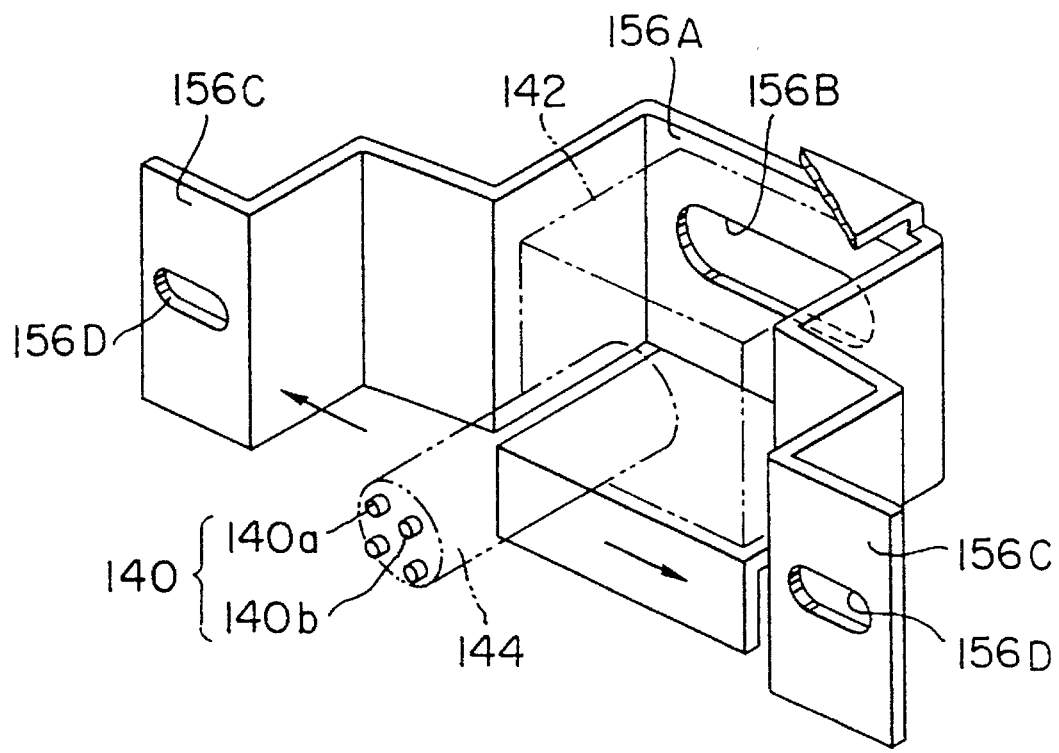
FIG. 12 is a partial perspective view showing principal portions of FIG. 11A.

As shown in FIG. 12, the thermocouple 140 is provided with a pair of upper and lower resistance wires 140*a* and 140*b*. The upper resistance wires 140*a* are used for detecting an unusual condition. The lower resistance wires 140*b* are used for controlling an operation.

Thus, even if the heat generating resistor 130 is deformed, the protecting member 144, into which the thermocouple 140 is inserted as the detecting portion, is not affected by the weight of the heat generating resistor 130. In other words, as shown in FIG. 9, the distal end of the thermocouple 140 is disposed nearly at the center between vertical portions 133 of the heat generating resistor 130 formed in the meander pattern. Thus, even if the heat generating resistor 130 is deformed, it does not contact the forward end of the thermocouple 140. Consequently, the protecting member 144 does not need more rigidity than the conventional protecting member. As a result, the outer diameter of the protecting member 144 can be reduced in comparison with the conventional protecting member. In reality, the outer diameter of the conventional protecting member 144, which is in the range of 6 to 8 mm, can be reduced by ½ or less.

According to this embodiment, since the outer diameter of the protecting member 144 can be reduced, the amount of heat radiated from the end portion can be decreased. In addition, since the heat capacity of the protecting member 144 is also small, the amount of heat absorbed by the protecting member 144 is small. Thus, a temperature detected in the furnace is not degraded by outer disturbance. Consequently, the difference between the real temperature and the detected temperature as a detecting signal can be reduced. The decrease of the difference does not degrade the detecting accuracy. Thus, the follow-up characteristic against the temperature variation can be improved.

In addition, according to this construction, since the amount of heat radiated from the protecting member 144 is small, the thickness of the heat insulator 134, which surrounds the outer periphery of the protecting member 144, can be reduced. In other words, the thickness (L2) of the conventional heat insulator 134 can be reduced to the thickness denoted by letter L1 of FIG. 11A (where L1<L2). Thus, the temperature change time of the temperature rise process and temperature drop process in the furnace can be reduced. In addition, the temperature change time in the temperature drop process can be reduced. Moreover, since the thickness of the heat insulator is reduced, the increase of the size of the heat treatment apparatus can be suppressed. In FIG. 11A, letter L represents the length of the thermocouple 140, which is inserted into the protecting member 144. The length L of the thermocouple 140 is the same as that of the conventional apparatus.

However, in this embodiment, to prevent the temperature detecting accuracy from degrading, not only the amount of heat transfer is decreased by the protecting member 144, but the heat radiation is suppressed. In other words, a temperature drop in the thermocouple 140 results from a leakage of heat due to heat transfer to the protecting member 144 and emission of the heat therefrom.

To prevent such leakage, the present invention has a construction for reducing heat radiation from the protecting member 144. In other words, in FIG. 11A, a cooling passageway 150 of the furnace is formed between the outer shell 146 and a water cooling cover 148. A passageway heat insulator member 152 is disposed on the outer periphery of the protecting member 144. The passageway heat insulator member 152 extends from the end of a bracket 156 to the outer shell 146. In this construction, the heat radiation from the cooling passageway 150 and the vicinity thereof can be suppressed. Thus, the temperature in the furnace can be precisely measured because the distal end of the thermocouple 140 is not cooled.

In this embodiment, the mounting position of the bracket can be adjusted corresponding to the inserted position of the detecting portion disposed between the heat generating resistor members formed in the meander pattern. In other words, in FIG. 12, the bracket (securing device) 156 for securing the holder 142 has a stair shaped cavity portion for holding the thermocouple 140 and the passageway heat insulator member 152. The peripheral size of the cavity portion is larger than that of the holder 142 and the passageway heat insulator member 152. Thus, the bracket 156 can be moved against the holder 142 and the passageway heat insulator member 152. In this embodiment, since a signal terminal 142A is provided outside the holder 142 (see FIG. 11A), a hole 156B of the terminal 142A on a bottom portion 156A and a screw hole 156D on a flange portion 156C mounted on the water cooling cover 148 are defined as long holes.

Thus, although the protecting member 144 is inserted into the hole on the heat insulator 134, when the bracket 156 is moved in the peripheral direction (denoted by arrow of FIG. 12), the bracket 156 can be aligned to the holder 142. This alignment is required due to the following reason.

Figure 13:
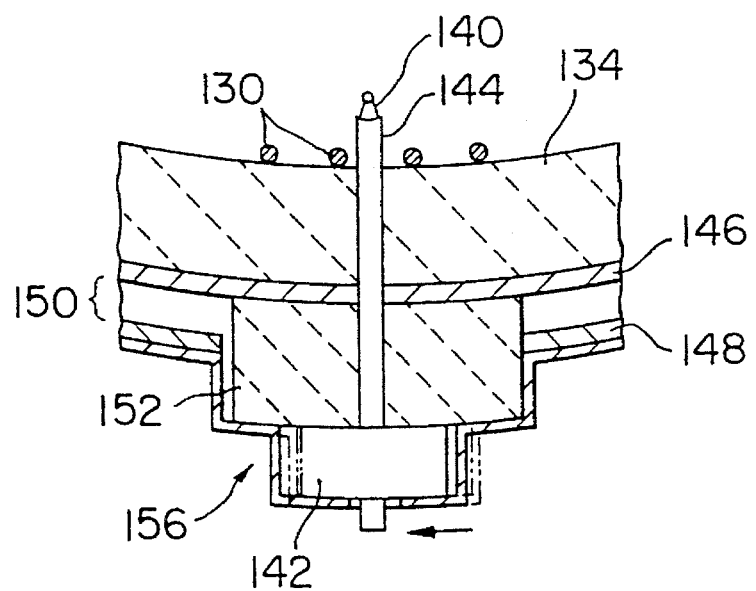
FIG. 13 is a sectional view taken along line P—P of FIG. 11A.

In the heat treatment apparatus having the heat generating resistor 130 formed in the meander pattern, before the heat generating resistor 130 is mounted, the hole for the thermocouple 140 is made from the inner wall of the furnace to the heat insulator by a drill. This is because the hole for the thermocouple 140 is made corresponding to the heat generating resistor 130 at site. If the mounting position of the bracket 156 were preset, the holder 142, the protecting member 144, which extends therefrom, and the thermocouple 140 would not accurately fit to the bracket 156. In extreme case, the bracket would interfere with the holder 142. In this embodiment, as shown in FIG. 13, when the bracket 156 is moved in arrow direction denoted by solid line, the position of the bracket 156 can be adjusted to the position of the holder 142 as denoted by two-dot-dash line.

According to this embodiment, the thickness of the heat insulator disposed on the wall of the furnace can be reduced. Thus, the transient response characteristics of the temperature rise/drop process in the furnace can be improved so as to shorten the temperature rise/drop time. Thus, the throughput for the heat treatment can be improved.

The present invention is not limited to the above-described embodiment. Instead, the embodiments may be modified in various manners without departing from the spirit and scope of the present invention.

The workpiece according to the present invention may be at least planar workpieces. Besides semiconductor wafers, the workpieces may be LCD substrates. The heat treatment apparatus according to the present invention is not limited to the oxidizing treatment apparatus and the diffusing treatment apparatus. Instead, the present invention may be applied to an apparatus for a CVD treatment, an annealing treatment, or the like.

As described above, according to the present invention since the distal end of the detecting portion is disposed between adjacent heat generating resistor members, even if they are deformed, the weight thereof is not applied to the detecting device. Since the outer diameter of the detecting device is small and the heat loss is small, the difference between the real temperature at the distal end of the detecting device and the detected temperature becomes small. Thus, the accuracy of the detected temperature can be prevented from being degraded. In addition, since the difference between the real temperature and the detected temperature is small, the response follow-up characteristics corresponding to the temperature change in the furnace can be improved. Moreover, since the detecting accuracy is not degraded, the detection error in the temperature rise/drop process is decreased so as to shorten the temperature rise/drop time. Thus, the control characteristics of the temperature control in the heat treatment process can be improved.

Third Embodiment

Next, with reference to FIGS. 14 to 18, a third embodiment of the present invention will be described. The third embodiment is similar to the second embodiment shown in FIGS. 8 to 13 except for the following points. For the simplicity, the portions similar to the second embodiment are denoted by the similar reference numerals and their detail description is omitted.

Figure 14:
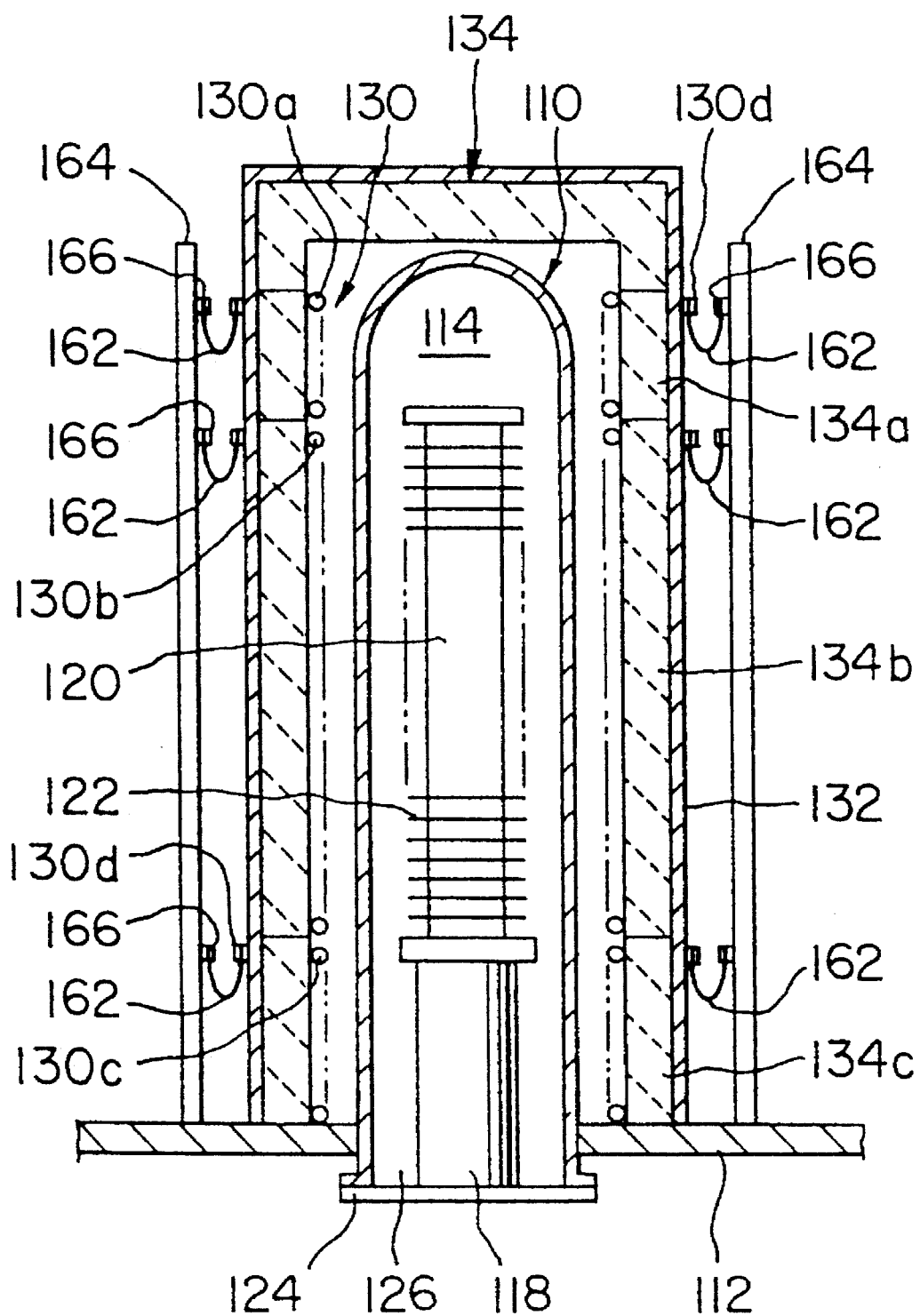
FIG. 14 is a sectional view showing a heat treatment apparatus according to a third embodiment of the present invention.
Figure 15:
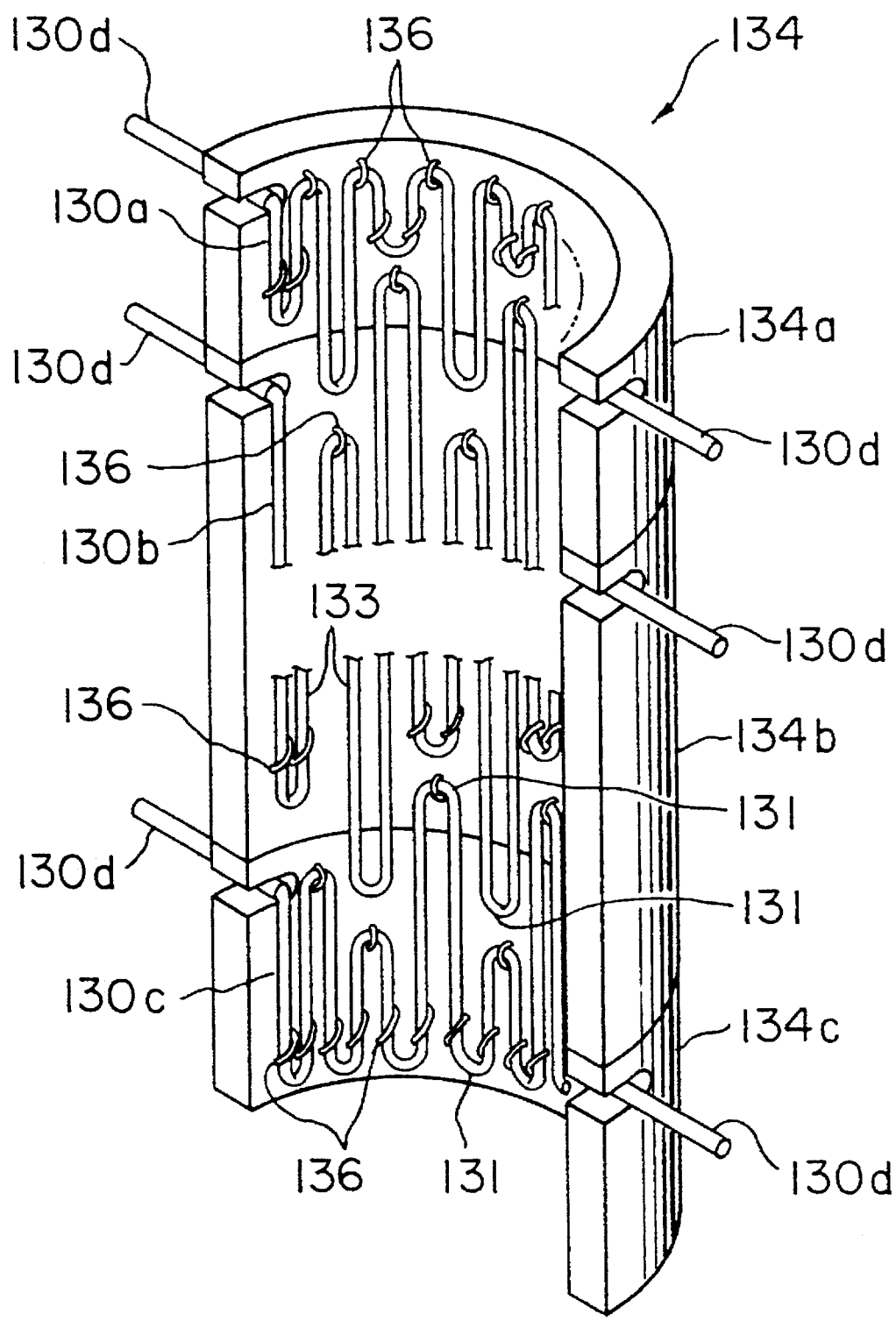
FIG. 15 is a perspective view showing a construction of heat generating resistor members used in the heat treatment apparatus of FIG. 14.
Figure 16:
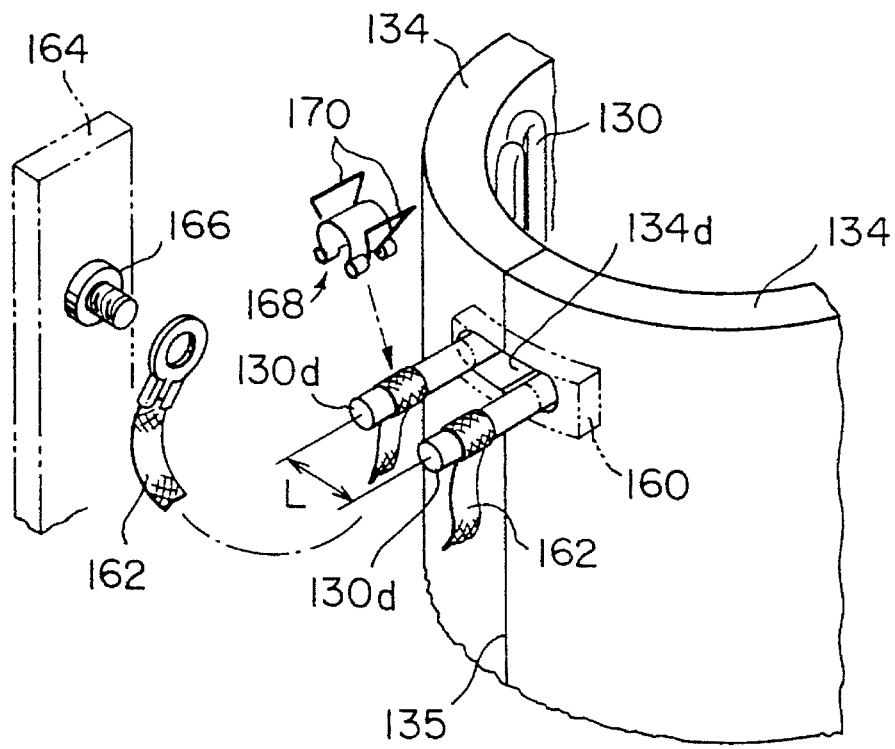
FIG. 16 is a perspective view showing a construction of principal portions of the heat treatment apparatus according to the present invention.

In FIGS. 14 to 16, an end portion 130d extends from a bend portion 131 at a most outer peripheral position of each of heat generating resistor members 130a, 130b, and 130c through a slit 134d. The slit 134d is formed on a divided surface 135 (see FIG. 16) where a heat insulator 134 is peripherally divided into two portions. The end portion 130d of the heat generating resistor 130 extends in parallel with the adjacent end portion 130d. The length (L) between the adjacent end portions 130d is as narrow as approximately 40 mm so as to prevent the non-heated region of the divided surface 135 from becoming large.

The end portions 130d of the heat generating resistor 130, which extend outward from the heat insulator 134, are inserted into a heat insulator member 160 disposed on the outer wall of the heat insulator 134 as denoted by two-dot-dash lines of FIG. 16. The heat insulator member 160 covers the slit 134d in the heat insulator 134. The end portions 130d, which penetrate the heat insulator member 160, are disposed in parallel with each other. Thus, the end portions 130d can be easily inserted into the insulator member 160.

The distal end of the heat generating resistor 130, which penetrates the heat insulator member 160, has a conductor layer made of aluminum or the like. A joint member 162 that is a flat woven wire made of a conductor such as aluminum is wound around the conductor layer. The joint member 162 serves to supply electricity to the heat generating resistor 130. One end of the joint member 162 is connected to the conductor layer of the heat generating resistor 130. The other end of the joint member 162 is connected to a terminal 166 of a joint terminal member 164 disposed in an outer space of the heat insulator 134. As shown in FIG. 16, the joint member 162 is connected to the terminal 166 in such a manner that a lag terminal is mounted at the end portion of the joint member 162 and the lag terminal is secured to the joint terminal with a screw.

Thus, since the joint member 162 connected to the joint terminal 166 is the light flat woven wire made of aluminum, when it is hung, a large load is not applied to the end portion 130d. In addition, since the distance between the end portion 130d and the terminal 166 is not large (namely, the span therebetween is small), a bending moment applied to the end portion 130d can be decreased.

Figure 17:
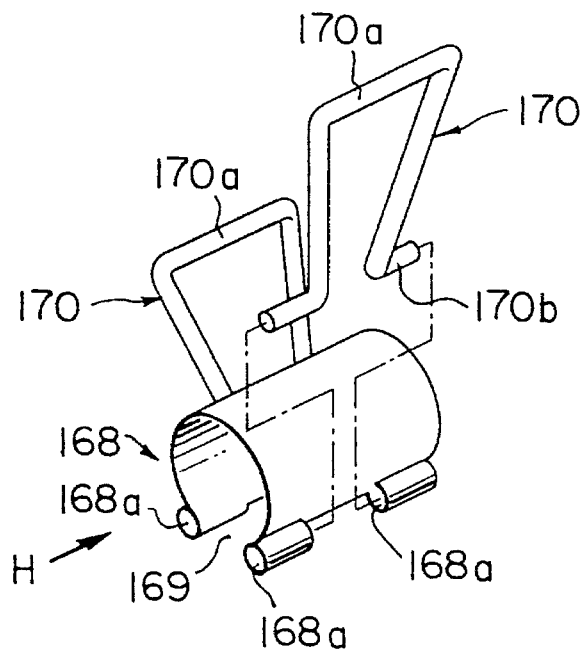
FIG. 17 is a partial perspective view of the principal portions of FIG. 16.
Figure 18:
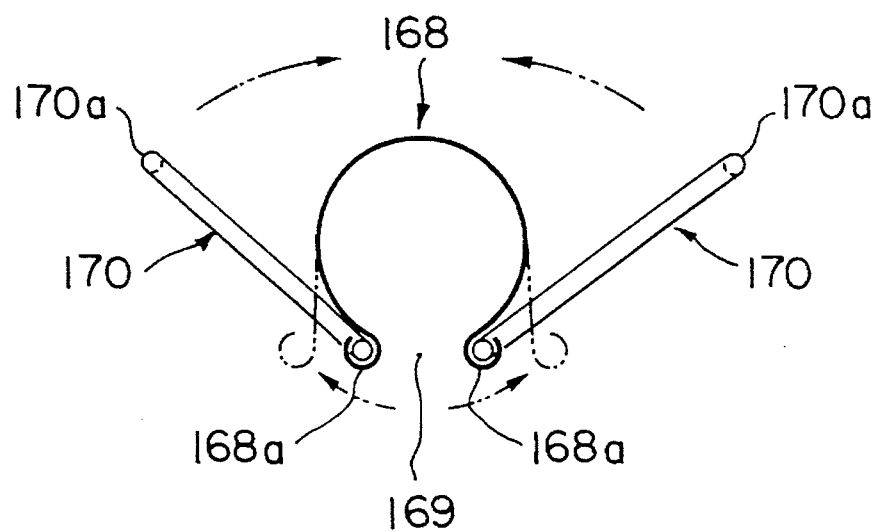
FIG. 18 is a view taken along line H—H of FIG. 17.

The joint member 162 is held by a nipping member 168 in such a manner that the joint member 162 is in contact with the end portion 130d of the heat generating resistor 130. In other words, as shown in FIGS. 17 and 18, the nipping member 168 is a clip-shaped cylindrical elastic member having a sectional shape similar to the end portion 130d of the heat generating resistor 130. The nipping member 168 has an opening 169 that axially extends to the outer peripheries thereof. The end portion 130d is inserted into the opening 169. The nipping member 168 is tensioned so that the opening 169 is closed by its elastic force. A pair of grip members 170 are detachably disposed on both sides of the opening portion 169 of the nipping member 168. Each of the grip members 170 has a grip portion 170a that extends outward from the opening portion 169 of the nipping member 168. The grip members 170 are slid about the body portion of the nipping member 168. As denoted by two-dot-dash line of FIG. 18, when both the grip portions 170a are gripped at the same time, the opening portion 169 can be opened against the elastic force of the nipping member 168. Thus, when the opening portion 169 is opened, the end portion 130d of the heat generating resistor 130 can be inserted thereinto. Thus, the nipping member 168 is mounted on the end portion 130d. After the end portion 130d of the heat generating resistor 130 is inserted into the opening portion 169 of the nipping member 168, the grip members 170 can be removed from the nipping member 168. In other words, the grip members 170 are made of a wire with an elastic characteristic. The opposite side of the grip member 170a is bent in the longitudinal direction of the nipping member 168 so that the grip member 170 is inserted into circular cylinder portions 168a disposed on the body portion of the nipping member 168 as shown in FIG. 17. Thus, the grip members 170 where the bend members 170b are inserted into the cylinder portions 168a disposed on the peripheries of the opening portion 169 of the nipping member 168 can be removed from the circular cylinder portions 168a of the nipping portion 168 by gripping the grip member 170.

Since this embodiment has the above-described construction, the end portion 130d of the heat generating resistor member 130 is mounted in such a manner that the end portion 130d extends outward from the slit 134d formed on the divided surface of the outer shell of the process tube. The end portion 130d of the heat generating resistor 130 is electrically connected to the terminal 166 of the joint terminal member 164 by the joint member 162 wound around the conductor layer and the terminal 166. The joint member 162 and the end portion 130d of the heat generating resistor 130 are kept in contact by the nipping member 168. In other words, when the grip portions 170a of the grip members 170 are gripped at the same time, the opening portion 169 is opened. At this point, the nipping member 168 is inserted into the end portion 130d. When the grip portions 170a are not gripped, the opening portion 169 of the nipping member 168 inserted into the end portion 130d is closed by the elastic force of the nipping member 168. Thus, the joint member 162 is pressured to the conductor layer so that the joint member 162 comes in contact with the conductor layer. After the end portion 130d is inserted into the nipping member 168, the bend members 170b are removed from the circular cylinder portions 168a of the nipping member 168.

Thus, only the nipping members 168 are left at the peripherally adjacent end portions 130d of the heat generating resistor 130. Thus, the grip portions 170a of the grip members 170 do not interfere with each other.

According to this embodiment, no part does not extend outward from the body portion of the nipping member 168 mounted on each of the adjacent end members of the heat generating resistor 130 on the other periphery of the end portion 130d of the heat generating resistors 130. Thus, the distance between the adjacent end portions 130d of the heat generating resistor 130, which extend outward from the slit 134d formed on the divided surface 135 can be decreased. In the related art reference, the distance between the adjacent end portions 130d of the heat generating resistor 130 is approximately 80 to 100 mm. However, according to this embodiment, the distance between the adjacent end portions 130d can be reduced to approximately 40 mm.

According to this embodiment, since the adjacent end portions 130d of the heat generating resistor 130 extend in parallel outward from the slit 134d formed on the divided surface 135 of the heat insulator 134, the end portions 130d can be easily inserted into the insulator member 160.

The present invention is not limited to the above-described embodiment. Instead, the embodiments may be modified in various manners without departing from the spirit and scope of the present invention.

The workpiece according to the present invention may be at least planar workpieces. Besides semiconductor wafers, the workpieces may be LCD substrates. The heat treatment apparatus according to the present invention is not limited to the oxidizing treatment apparatus and the diffusing treatment apparatus. Instead, the present invention may be applied to an apparatus for a CVD treatment, an annealing treatment, or the like.

As described above, according to the present invention, since electricity is supplied to the heat generating resistor by the joint members, which are light in weight, an excessive bending moment is not applied to the heat generating resistor. Thus, the heat generating resistor can be prevented from being broken by an excessive load.

In addition, according to the present invention, since the distance between the adjacent members of the heat generating resistor disposed on the divided surface of the process tube can be decreased, the temperature distribution in the peripheral direction of the furnace can be equalized.

Fourth Embodiment

Next, with reference to FIGS. 19 and 20, a fourth embodiment of the present invention will be described. The fourth embodiment is the same as the second embodiment shown in FIGS. 8 to 13 except for the following points. For the simplicity, the portions similar to the second embodiment are denoted by the similar reference numerals and their description is omitted. FIG. 20 shows an arrangement of a heat generating resistor 130.

In FIG. 20, a heat generating resistor member 130b that is a center portion of the heat generating resistor 130 is provided with a heat generating resistor member $130b_1$ and $130b_2$. As shown in FIG. 20, the heat generating resistor members $130b_1$ and $130b_2$ have vertical portions 133 and bend portions 131. Each of the heat generating resistor members $130b_1$ and $130b_2$ are formed of one wire. The wire is vertically extended and bent in U shape at upper and lower ends a predetermined number of times. The vertically routed portions are referred to as the vertical portions 133, whereas the U-shaped portions are referred to as the bend portions 131. This continuous pattern is referred to as meander pattern.

In FIG. 20, for the simplicity, it is assumed that the upper end of the heat generating resistor member $130b_1$ and the lower end of the heat generating resistor member $130b_2$ are aligned with each other.

Figure 19A:
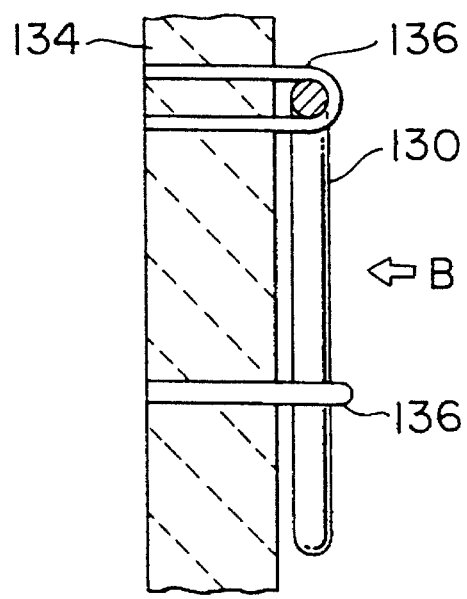
FIG. 19A is a sectional view showing a securing construction of a heat generating resistor member of a heat treatment apparatus according to a fourth embodiment of the present invention.
Figure 19B:
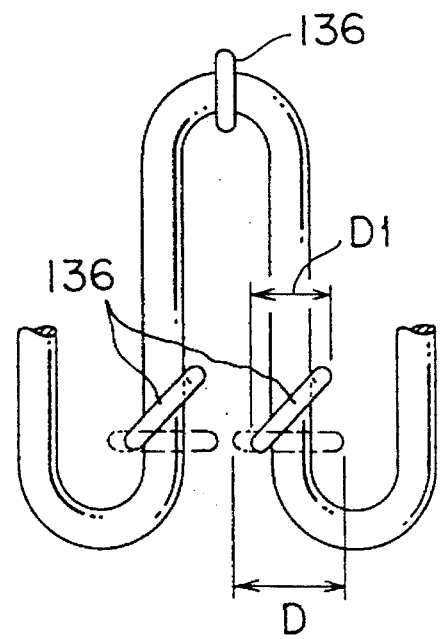
FIG. 19B is a view taken along line B—B of FIG. 19A.
Figure 20:
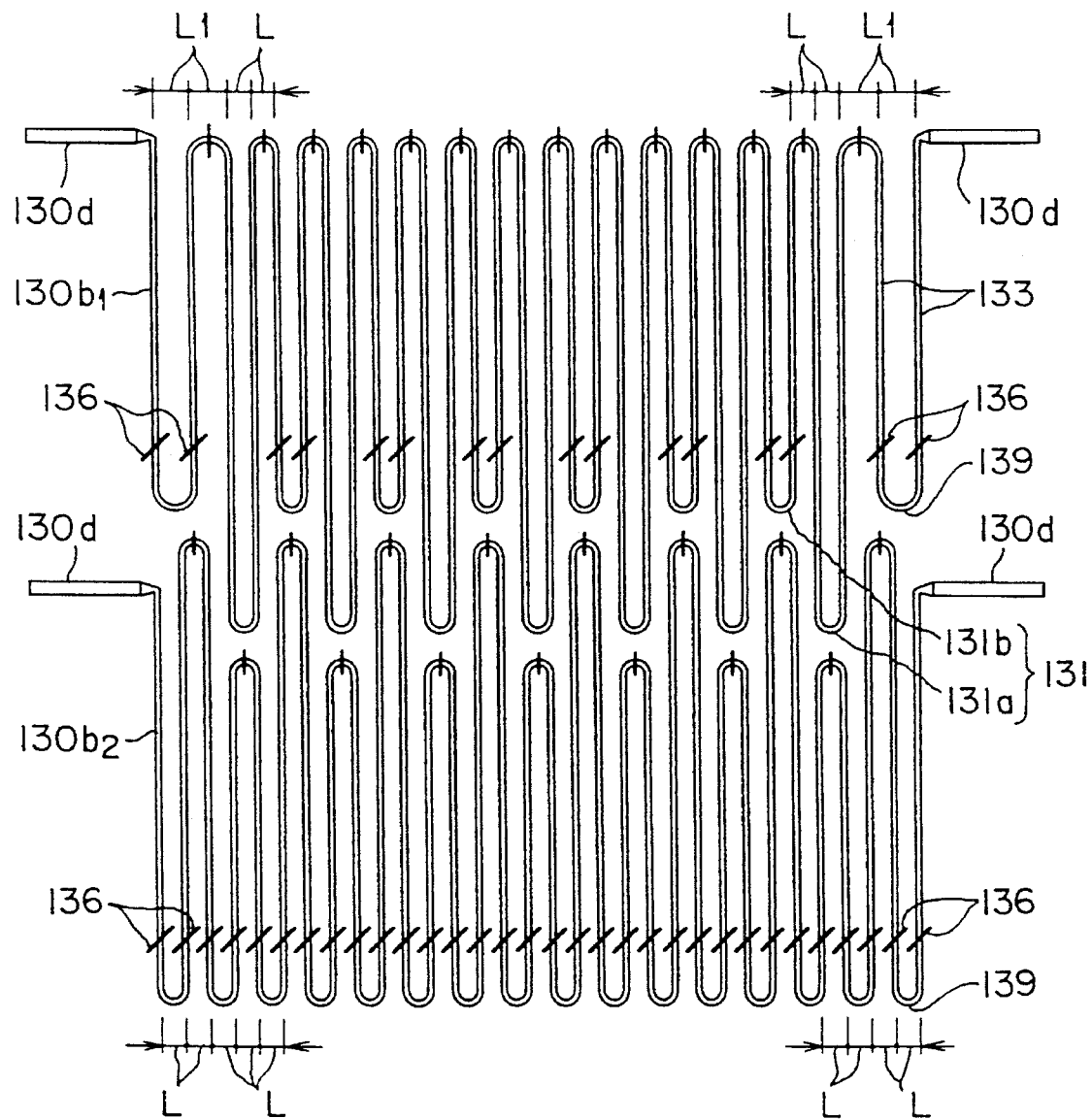
FIG. 20 is a development view showing principal portions of the heat treatment apparatus.

As shown in FIGS. 19A and 19B, the heat generating resistor members $130b_1$ and $130b_2$ arranged in the meander pattern are mounted and held on the inner surfaces of the corresponding members of the heat insulator 134 by staples 136. As shown in FIGS. 19B and 20, the staples 136 hang and support the heat generating resistor members 130b1 and 130b2 at the upper bend portions 131. In addition, the stales 136 secure the heat generating resistor members 130b1 and 130b2 at their lower vertical portions 133 other than the lower bend portions 131 in such a manner that the staples 136 have an angle with the heat generating resistor members $130b_1$ and $130b_2$. Since the lower bend portions 131 of the heat generating resistor members $130b_1$ and $130b_2$ are kept open, the heat generating resistor members $130b_1$ and $130b_2$ can vertically move corresponding to heat expansion and heat shrinkage. In addition, since the staples 136 are driven into the heat insulator with an angle, as shown in FIG. 19B, the pitches of the vertical portions 133 of the heat generating resistor members can be more closely determined than the case that the staples 136 are driven horizontally. Thus, when the width between adjacent vertical portions 133 in the case that the staples 136 are driven with an angle is denoted by D and the width in the case that the staples 136 are driven horizontally is D1, there is relation of D>D1.

As shown in FIG. 20, the heat generating resistor members $130b_1$ and $130b_2$ are disposed in an upper zone and a lower zone, respectively. At the boundary of the heat generating resistor members $130b_1$ and $130b_2$, the bend portions 131 thereof become long and short one after the other. Thus, the bend portions 131 are closely and regularly arranged at the boundary. As a result, the boundary between heating zones can be equally heated.

As shown in FIG. 20, the difference between a longer bend portion 131a and a shorter bend portion 131b is constant. End portions of the heat generating resistor members $130b_1$ and $130b_2$ are extracted to the outside of the heat insulator 134 at an upper position of each zone. Thus, a last bend portion 139 of each heat generating resistor member $130b_1/130b_2$ is disposed at a lower position of each zone.

When the bend portions 131 of the heat generating resistors $130b_1$ and $130b_2$ are engaged with each other, the number of the bend portions 131 of the heat generating resistor member $130b_1$ differs from the number of the bend portions 131 of the heat generating resistor member $130b_2$.

To prevent such a problem, in this embodiment, the pitches of the bend portions 131 of one of the heat generating resistor members $130b_1$ and $130b_2$ differ between end portions and center portion thereof.

FIG. 20 is a development view for explaining the relation between the heat generating resistor members $130b_1$ and $130b_2$ in the center zone. As shown in FIG. 20, the peripheral arrangement pitches of the bend portions 131 of the lower heat generating resistor member $130b_2$ are the same. These peripheral arrangement pitches are denoted by L. On the other hand, the peripheral arrangement pitches of the bend portions 131 of the upper heat generating resistor member $130b_1$ are different between the end portions and the center portion thereof. The peripheral arrangement pitches at the end portions are denoted by L1, whereas the peripheral arrangement pitches at the center portion are denoted by L. In this embodiment, the peripheral arrangement pitches at the end portions (L1) are larger than the peripheral arrangement pitches at the center portion (L). With such different pitches L1 and L, even if the length between the longer bend portions 131a and the shorter bend portions 131b of the heat generating resistor member $130b_1$ accords with those of the heat generating resistor member $130b_2$, the end portions 130d extracted to the outside can be placed at the upper position of each heating zone in both the cases of the heat generating resistor members $130b_1$ and $130b_2$.

In other words, when the bend portions 131 of the heat generating resistor members $130b_1$ and $130b_2$ are engaged with each other, the positions of the end portions of the heat generating resistor member $130b_1$ accord with the positions of the end positions of the heat generating resistor member $130b_2$. In this case, the last bend portions 139 adjacent to the end portions 130d are engaged with the corresponding bend portions 131 with a different radius of curvature. It should be noted that the pitches of the bend portions 131 may differ in the lower heat generating resistor member $130b_2$ instead of the upper heat generating resistor member $130b_1$.

The arrangement pitches of the bent portions 131 may be adjusted between the upper heat generating resistor member 130a and the lower heat generating resistor member 130b.

Since this embodiment has the above-described construction, the distance between the end portions 130d of the heat generating resistor member $130b_1$ is the same as the distance between the end portions 130d of the heat generating resistor member $130b_2$. Thus, since the resistance of the heat generating resistor member $130b_1$ is the same as the resistance of the heat generating resistor member $130b_2$, they are connected to the same power source for each zone.

On the other hand, as described above, when one of the heat generating resistor members $130b_1$ and $130b_2$ has different pitches between the end portions and center portion thereof, the end portions 130d of the heat generating resistor members $130b_1$ and $130b_2$ can be placed at the same common positions in each zone (namely, the end portions 130d can be placed at upper common positions in each zone). Thus, since the mounting positions of the terminals 130d of the heat generating resistor members $130b_1$ and $130b_2$ become common in each divided zone of the furnace, the positions of the terminals 130d become common and each zone of the furnace can be formed in the same shape. In addition, the peripheral positions of the end portions 130d are the same. In other words, each of the heat generating resistor members $130b_1$ and $130b_2$ is formed of a pair of semi-circular cylinder members so as to peripherally heat the process chamber. Thus, when the length of the heat generating resistor member $130b_1$ is the same as the length of the heat generating resistor member $130b_2$, the peripheral beginning position thereof accords with the peripheral last position. Thus, for example a peripheral holding position, which is used for an assembling work, becomes common in each zone.

According to this embodiment, when the heat generating resistor members $130b_1$ and $130b_2$ with the bend portions 131 are pre-formed, the end portions 130d can be placed at the same positions in each zone of the furnace. In other words, when the heat generating resistor member $130b_1$ opposed to the heat generating resistor member $130b_2$ having the bend portions 130 arranged with the equal pitches has the bend portions with different pitches between end positions and center position thereof and when the length of the heat generating resistor member $130b_1$ is the same as the length of the heat generating resistor member $130b_2$, the end portions of the heat generating resistor member $130b_1$ become the same as the end portions of the heat generating resistor member $130b_2$. Thus, when the length of the heat generating resistor member $130b_1$ is the same as the length of the heat generating resistor member $130b_2$, the same power source can be used. As a result, the same power supply specifications can be used for each heating zone.

The present invention is not limited to the above-described embodiment. Instead, the embodiments may be modified in various manners without departing from the spirit and scope of the present invention.

The workpiece according to the present invention may be at least planar workpieces. Besides semiconductor wafers, the workpieces may be LCD substrates. The heat treatment apparatus according to the present invention is not limited to the oxidizing treatment apparatus and the diffusing treatment apparatus. Instead, the present invention may be applied to an apparatus for a CVD treatment, an annealing treatment, or the like.

As described above, according to the present invention, the bend portions are alternately engaged with each other at the boundary of the adjacent zones in the peripheral direction. Thus, since the same power can be supplied to each heat generating resistor member, the same power source can be used.

In addition, when the length of the heat generating resistor members is the same, the positions of the end portions of the heat generating resistor members become common in each zone. In other words, in the case that the bend portions are engaged with each other at the boundary of the adjacent heat generating resistor members, when one of the heat generating resistor members has different pitches of the bend portions between end portions and center portion thereof, the positions of the end portions become common in each zone. Thus, since the end portions of the heat generating resistor members are placed at the same upper positions in corresponding heating zones, even if the heat generating resistor member is expanded by heat, the terminals can be prevented from being broken. In addition, the shape of the heat generating resistor members and assembling process thereof can become common. Thus, the total cost of the apparatus including machining cost can be reduced.

Fifth Embodiment

Next, with reference to FIG. 21, a fifth embodiment of the present invention will be described. The fifth embodiment is the same as the fourth embodiment shown in FIGS. 19A to 20 except for the following point. In the fifth embodiment, a heat generating resistor member disposed in the same heating zone (for example, a heat generating resistor member $130b_1$) is peripherally divided into two portions that are a first heat generating resistor member 180 and a second heat generating resistor member 181. End portions of the first heat generating resistor member 180 and the second heat generating resistor member 181 are disposed adjacent to each other.

For the simplicity, the portions similar to the fourth embodiment shown in FIGS. 19A to 20 are denoted by the similar reference numerals and their description is omitted.

Figure 21:
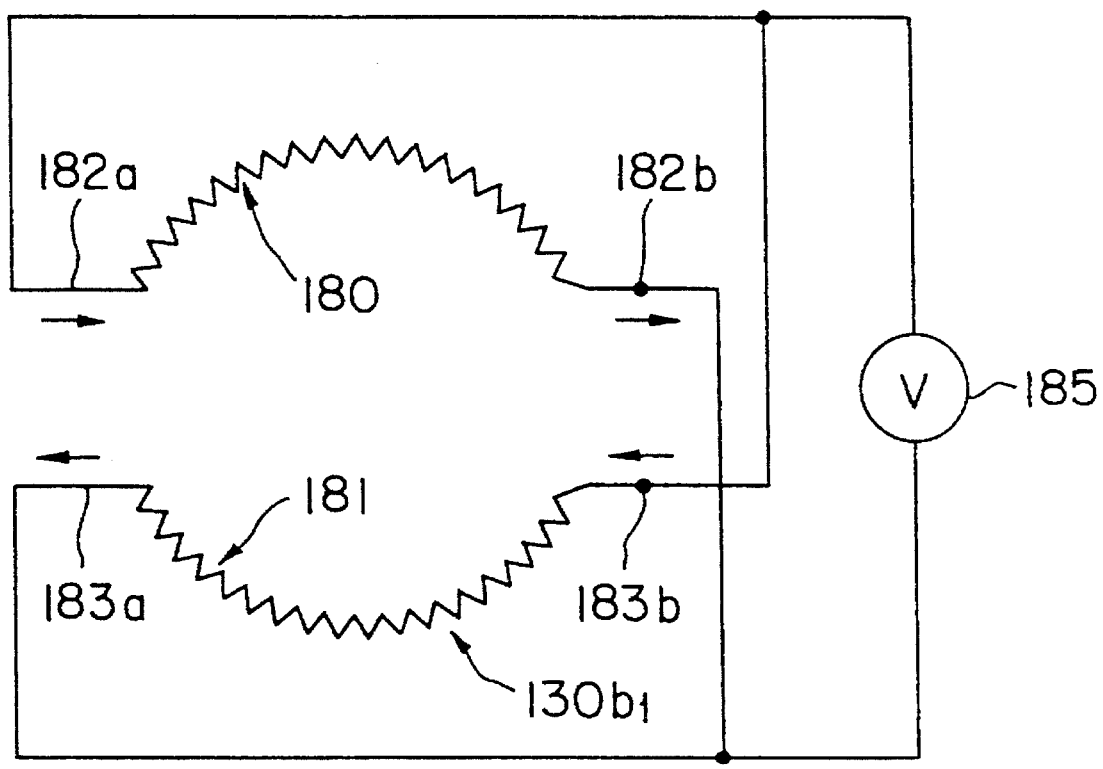
FIG. 21 is a circuit diagram showing heat generating resistor member of a heat treatment apparatus according to a fifth embodiment of the present invention.

In FIG. 21, as described above, the heat generating resistor member $130b_1$ is peripherally divided into two portions, which are the first heat generating resistor 180 and the second heat generating resistor 181. End portions 182a, 182b, 183a, and 183b of the heat generating resistor members 180 and 181 each have a terminal connected to a power source. The first end portion 182a of the first heat generating resistor member 180 is disposed adjacent to the second terminal portion 183b of the second heat generating resistor 181.

In FIG. 21, the current directions at the end portions 182a and 182b of the first heat generating resistor member 180 are reverse to those at the end portions 183a and 183b of the second heat generating resistor member 181 respectively. In other words, the first end portion 182a of the first heat generating resistor member 180 and the second end portion 183b of the second heat generating resistor member 181 are connected to a first terminal of the power source 185. The second end portion 182b of the first heat generating resistor 180 and the first end portion 183a of the second heat generating resistor member 181 are connected to a second terminal of the power source 185. Thus, the heat generating resistor members 180 and 181 are connected to the power source 185 in parallel.

The first and second heat generating resistors 180 and 181 have the same length and same diameter. Thus, since the resistance of the heat generating resistor member 180 is the same as the resistance of the heat generating resistor member 181, they are connected to the same power source 185 in each zone. In addition, since the heat generating resistor members 180 and 181 are connected in parallel, the combined resistance of thereof is halved. Thus, even if the treatment object is changed to large workpieces, excessively high voltage is not required.

Moreover, the current direction at the first end portion 182a of the first heat generating resistor member 180 is the reverse to the current direction at the first end portion 183a of the second heat generating resistor member 181. Thus, the magnetic force generated by the current that flows in the end portion 182a is offset by the magnetic force generated by the current that flows in the end portion 183a. Consequently, a load caused by the magnetic force is not applied to the end portions 182a and 183a. Likewise, such a load is not applied to the end portions 182b and 183b of the first and second heat generating resistor members 180 and 181.

According to the fifth embodiment, as with the fourth embodiment shown in FIG. 20, when the heat generating resistor 130 having bend portions is pre-formed, the terminals 130d can be disposed in the same position in each zone of the furnace. In other words, when the heat generating resistor member 130b₁ opposed to the heat generating resistor member 130b₂ having the bend portions 131 arranged in equal pitches has different pitches of the bend portions between end portions and center portion thereof and when the length of the heat generating resistor member 130b₁ is the same as the length of the heat generating resistor member 130b₂, the positions of the end portions become common. Thus, the same power source 185 is used for the heat generating resistor member 130 with the predetermined length without need to modify the power specifications for each zone.

The present invention is not limited to the above-described embodiment. Instead, the embodiments may be modified in various manners without departing from the spirit and scope of the present invention.

The workpiece according to the present invention may be at least planar workpieces. Besides semiconductor wafers, the workpieces may be LCD substrates. The heat treatment apparatus according to the present invention is not limited to the oxidizing treatment apparatus and the diffusing treatment apparatus. Instead, the present invention may be applied to an apparatus for a CVD treatment, an annealing treatment, or the like.

First and second heat generating resistor members may be disposed in each heating zone. In this case, the end portions of the first heat generating resistor members in the heating zones may be disposed adjacent to each other. In addition, the current direction at adjacent end portions may be reverse of each other. In this case, the first end portion of the first heat generating resistor member in the first heating zone may be connected to the second end portion of the first heat generating resistor member in the second heating zone. The second end portion of the first heat generating resistor member in the first heating zone may be connected to the first end portion of the first heat generating resistor member in the second heating zone. This may apply to the second heat generating resistor member.

As described above, according to the present invention, since the current direction at a terminal of one of divided members of a heat generating resistor is reverse of the current direction at a terminal of the other member, the magnetic forces generated by these members can be offset. Thus, a load applied to the heat generating resistor does not increase by the magnetic force. Consequently, the wiring process for determining terminal positions is not required.

In addition, the length of two heat generating resistor members, where the bend portions are engaged with each other at the boundary of two heating zones, is the same. Thus, since these heat generating resistor members have the same resistance, the same power can be supplied thereto. Consequently, the same power source can be used for these heat generating resistor members.

Moreover, since the end portions of the heat generating resistor members divided in zones or in peripheral direction are connected to the power source in parallel, the combined resistance of the heat generating resistor members can be decreased. Thus, even if large workpieces are heat-treated, it is not necessary to remarkably increase power, in particular, voltage. Consequently, the scale of the power equipment can be prevented from being increased.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A heat treatment apparatus, comprising:

an upright type process tube having at least one opening and for performing a batch treatment for a plurality of workpieces accommodated in a boat;

a heat insulator disposed outside said upright type process tube;

a heat generating resistor disposed between said heat insulator and said upright type process tube and for heating the workpieces disposed in said upright type process tube through heat radiation;

a vertically movable conveying device for loading and unloading the boat accommodating the workpieces, into and from the opening of said upright type process tube;

a temperature keeping member for supporting the boat; and a nozzle having a nozzle opening disposed between said upright type process tube and said heat generating resistor and for blowing a cooling air, wherein the nozzle blows the cooling air to a wall surface portion of said upright type process tube corresponding to an arrangement area of the workpieces.

2. The heat treatment apparatus as set forth in claim 1, wherein the nozzle opening of the nozzle faces to nearly a center portion of the arrangement area of the workpieces.

3. The heat treatment apparatus as set forth in claim 1, wherein the heat insulator has an exhaust opening portion for exhausting a waste air blown to the wall surface of said upright type process tube, and said exhaust opening and said nozzle are connected by a circulation line.

4. The heat treatment apparatus as set forth in claim 3, wherein the circulation line has a heat exchanger for cooling the waste air exhausted thereto.

5. The heat treatment apparatus as set forth in claim 4, wherein an outer air replenishing device for replenishing an outer air to the circulation line is disposed on the circulation line adjacent to said nozzle.

6. The heat treatment apparatus as set forth in claim 1, wherein the sectional shape of said nozzle is nearly oval, and the shorter axis of the sectional shape corresponds to the radius direction of said upright type process tube.

7. The heat treatment apparatus as set forth in claim 1, wherein the surface load of said heat generating resistor is 10 W/cm$^2$ or more.

8. A heat treatment apparatus, comprising:

an upright type process tube for performing a batch treatment for a plurality of workpieces;

a cylindrical heat generating resistor disposed outside said upright type process tube;

a heat insulator disposed outside said heat generating resistor; and a pipe for supplying a process gas into said upright type process tube, wherein said heat generating resistor has a thin wire heater whose diameter is in the range of 1.5 mm to 6 mm, and wherein the thin wire heater is disposed in a meander pattern.

9. A heat treatment apparatus, comprising:

an upright type process tube for performing a batch treatment for a plurality of workpieces;

a cylindrical heat insulator disposed outside said upright type process tube;

a heat generating resistor disposed on an inner wall surface of said heat insulator, said heat generating resistor having a plurality of vertical portions peripherally spaced and a plurality of bend portions disposed alternately at upper and lower positions of the vertical portions, the vertical portions being connected to each other through the bend portion; and a detecting device for detecting the temperature inside said heat insulator, wherein said detecting device penetrates said heat insulator, the distal end of said detecting device extends inside said heat insulator, and the distal end is disposed between the adjacent vertical portions of said heat generating resistor.

10. The treatment apparatus as set forth in claim 9, wherein a water cooling cover is disposed outside said heat insulator for forming a cooling portion with said heat insulator, and said detecting portion penetrates said heat insulator and the cooling portion, a portion of said detecting device corresponding to said cooling portion being surrounded by a passageway heat insulator portion.

11. The heat treatment apparatus as set forth in claim 10, wherein an outer end of said detecting device is secured at an outer surface of said water cooling cover by a fastener, the fastener being peripherally movable.

12. The heat treatment apparatus as set forth in claim 9, wherein the distal end of said detecting device is disposed at nearly a center position between the vertical portions of said heat generating resistor.

13. A heat treatment apparatus, comprising:

an upright type process tube for performing a batch treatment for a plurality of workpieces;

a heat insulator disposed outside said upright type process tube and peripherally divided into two portions;

a heat generating resistor disposed on an inner wall surface of each of divided portions of said heat insulator, both end portions of each heat generating resistor extending outward from the corresponding divided portions of said heat insulator; and a joint terminal member disposed outside and in the vicinity of each of the divided portions of said heat insulator, said joint terminal member having electrode terminals opposed to the both end portions of said heat generating resistor, wherein the electrode terminals of said joint terminal member and terminal portions of said heat generating resistor are connected by flat woven members.

14. The heat treatment apparatus as set forth in claim 13, wherein an end portion of said heat generating resistor disposed on one divided portion of said heat insulator is adjacent to an end portion of said heat generating resistor disposed on the other divided portion of said heat insulator.

15. The heat treatment apparatus as set forth in claim 14, wherein the flat woven members are wound around the corresponding end portions of said heat generating resistor, the flat woven members being in contact with the corresponding members of the heat generating resistor by nipping members.

16. The heat treatment apparatus as set forth in claim 15, wherein the nipping member comprises an elastic cylindrical member having an opening portion extending in the axial direction of said elastic cylindrical member, and grip members detachably disposed on the elastic cylindrical member for opening the opening portion against the elastic force of the elastic cylindrical member.

17. A heat treatment apparatus, comprising:

an upright type process tube for performing a batch treatment for a plurality of workpieces;

a heat insulator disposed outside said upright type process tube and vertically divided into a plurality of heating zones; and heat generating resistor disposed on an inner wall surface of each heating zone of said heat insulator, said heat generating resistor having a plurality of vertical portions peripherally spaced and a plurality of bend portions disposed alternately at upper and lower positions of the vertical portions, the vertical portions being connected to each other through the bend portion, wherein the bend portions of each of said heat generating resistors extend beyond the boundary of the heating zones so that the bend portions are engaged with each other at the boundary of the adjacent heating zones, and wherein both end portions of each heat generating resistor protrude outward from said heat insulator at the upper end of the corresponding heating zone, the bend portions adjacent to both end portions being disposed at the lower end of the corresponding heating zone.

18. The heat treatment apparatus as set forth in claim 17, wherein the peripheral arrangement pitches of the vertical portions of one heat generating resistor between adjacent heating zones are nearly constant, whereas the peripheral arrangement pitches of the vertical portions of the other heat generating resistor members are not constant.

19. The heat treatment apparatus as set forth in claim 18, wherein the peripheral arrangement pitches of the vertical portions at both end portions of the other heat generating resistor differ from those of a center portion thereof.

20. The heat treatment apparatus as set forth in claim 19, wherein the peripheral arrangement pitches of the vertical portions at both the end portions of the other heat generating resistor are larger than those of the center portion thereof.

21. The heat treatment apparatus as set forth in claim 17, wherein said heat generating resistor disposed on each of the heating zones has the same diameter and the same length.

22. A heat treatment apparatus, comprising:

an upright type process tube for performing a batch treatment for a plurality of workpieces;

a heat insulator disposed outside said upright type process tube; and a first heat generating resistor and a second heat generating resistor peripherally divided and disposed on an inner wall surface of said heat insulator, both end portions of each of said first and second heat generating resistors extending outward from said heat insulator, wherein one end portion of said first heat generating resistor is adjacent to one end portion of said second heat generating resistor member, the current direction of the one end portion of said first heat generating resistor being reverse to that of the one end portion of said second heat generating resistor member.

23. The heat treatment apparatus as set forth in claim 22, wherein each of the end portions of said first heat generating resistor is adjacent to the corresponding end portion of said second heat generating resistor.

24. A heat treatment apparatus, comprising:

an upright type process tube for performing a batch treatment for a plurality of workpieces;

a heat insulator disposed outside said upright type process tube and having a plurality of heating zones disposed in vertical direction of said upright type process tube; and a heat generating resistor disposed on an inner wall surface of each heating zone of said heat insulator, both end portions of each heat generating resistor extending outward from said heat insulator, wherein an end portion of said heat generating resistor in one heating zone is adjacent to an end portion of said heat generating resistor in the other heating zone adjacent to the one heating zone, the current direction at the end portion of the heat generating resistor in the one heating zone is reverse to that at the end portion of the heat generating resistor in the other heating zone.

25. The heat treatment apparatus as set forth in claim 24, wherein said heat generating resistor in each heating zone has the same diameter and the same length.

26. A heat treatment method for performing a heat treatment for a plurality of workpieces coaxially and vertically disposed in an upright type process tube in an airtight atmosphere, said method comprising the steps of:

performing a heat treatment; and blowing a cooling air toward a wall surface portion of the process tube corresponding to a center portion of an arrangement area of the workpieces or a higher portion thereof.

27. A heat treatment apparatus, comprising:

an upright type process tube having at least one opening and for performing a batch treatment for a plurality of workpieces accommodated in a boat;

a heat insulator disposed outside said upright type process tube;

a heat generating resistor disposed between said heat insulator and said upright type process tube and for heating the workpieces disposed in said upright type process tube through heat radiation;

a vertically movable conveying device for loading and unloading the boat accommodating the workpieces, into and from the opening of said upright type process tube; and a nozzle having a nozzle opening disposed between said upright type process tube and said heat generating resistor and for blowing a cooling gas, wherein the nozzle blows the cooling gas against a wall surface portion of said upright type process tube corresponding to an arrangement area of the workpieces, and wherein the heat insulator has an exhaust opening portion for exhausting a waste gas blown to the wall surface of said upright type process tube, and said exhaust opening and said nozzle are connected by a circulation line.

28. The heat treatment apparatus as set forth in claim 27 wherein the nozzle opening of the nozzle faces to nearly a center portion of the arrangement area of the workpieces.

29. The heat treatment apparatus as set forth in claim 27 wherein said nozzle is formed of a quartz material.

30. A heat treatment method for performing a heat treatment for a plurality of workpieces coaxially and vertically disposed in an upright type process tube in an airtight atmosphere, said method comprising the steps of:

performing a heat treatment; and blowing a cooling gas toward a wall surface portion of the process tube which wall surface portion forms part of a surface which is external to an interior surface of said process tube and which wall surface portion corresponds to a center portion of an arrangement area of the workpieces or a higher portion thereof.

* * * * *